(12) United States Patent
Uraki

(10) Patent No.: US 7,675,515 B2
(45) Date of Patent: Mar. 9, 2010

(54) APPARATUS, AND METHOD FOR GENERATING ANALYTICAL MODEL, AND RECORDING MEDIUM IN WHICH PROGRAM FOR GENERATING ANALYTICAL MODEL IS STORED

(75) Inventor: Yasushi Uraki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 868 days.

(21) Appl. No.: 11/406,277

(22) Filed: Apr. 19, 2006

(65) Prior Publication Data
US 2007/0176924 A1 Aug. 2, 2007

(30) Foreign Application Priority Data
Jan. 31, 2006 (JP) .............................. 2006-022243

(51) Int. Cl.
*G06T 17/00* (2006.01)
(52) U.S. Cl. ........................ 345/420; 345/423; 345/629
(58) Field of Classification Search ................ None
See application file for complete search history.

(56) References Cited

U.S. PATENT DOCUMENTS

| | | | | |
|---|---|---|---|---|
| 5,892,515 A | * | 4/1999 | Kobayashi et al. .......... | 345/423 |
| 5,936,869 A | * | 8/1999 | Sakaguchi et al. .......... | 703/1 |
| 7,050,876 B1 | * | 5/2006 | Fu et al. .................. | 700/118 |
| 2003/0078758 A1 | * | 4/2003 | Hariya et al. .............. | 703/2 |

FOREIGN PATENT DOCUMENTS

| | | |
|---|---|---|
| JP | 10-31759 | 2/1998 |
| JP | 2000-194881 | 7/2000 |
| JP | 2000-331194 | 11/2000 |
| JP | EP-1189176 A2 * | 3/2002 |

OTHER PUBLICATIONS

A. Ueda, et al., "High-Speed Modeling of VPS/Simulation-HUB", Fujitsu, vol. 55, No. 3, p. 232-237, May 2004.

\* cited by examiner

*Primary Examiner*—Ulka Chauhan
*Assistant Examiner*—Andrew Yang

(57) ABSTRACT

An apparatus for generating an analytical model of an object shape model including: a detail-mesh-model generating section generating a detail mesh model of the object shape model based on the object shape model; a maximum outer shape mesh model generating section generating a maximum outer shape mesh model corresponding to an outline of the object shape model based on the object shape model; a wall-thickness-region generating section generating a basic wall-thickness region, which extends inside the maximum outer shape mesh model from at least a part of surfaces of the maximum outer shape mesh model and which has a predetermined thickness; and an overlaying section generating said analytical model by using a result of overlaying the detail mesh model with the basic wall-thickness region. Easy simplification of an analytical model can reduce time required for numerical analysis to realize an effective designing process.

12 Claims, 21 Drawing Sheets

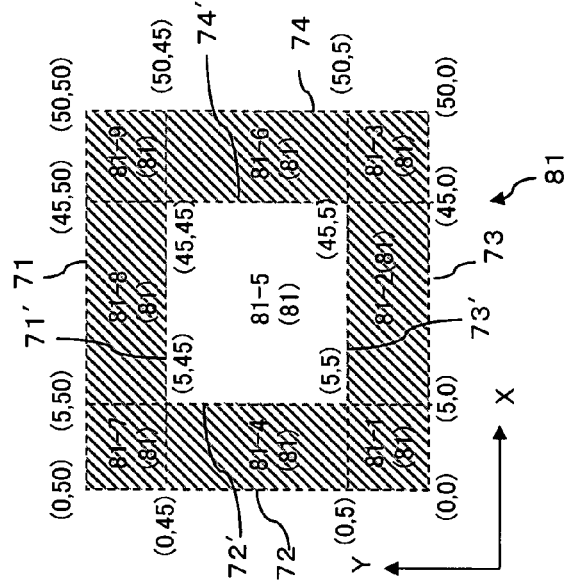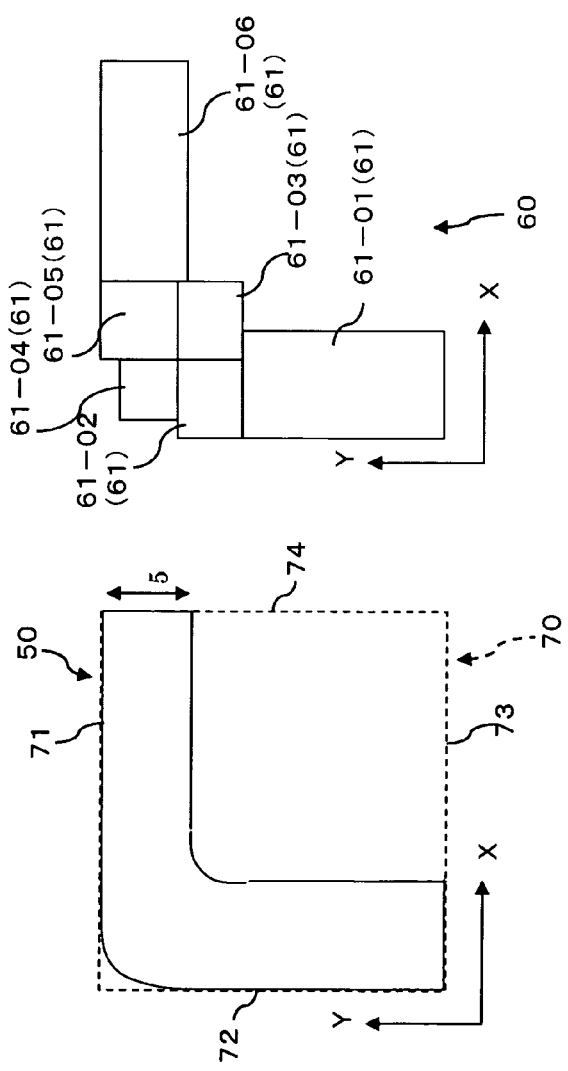

FIG. 5

| No. | ORTHOGONAL MESH | X-LOW | X-HIGH | Y-LOW | Y-HIGH | Z-LOW | Z-HIGH |
|---|---|---|---|---|---|---|---|
| 01 | 61-01 | 0 | 5 | 0 | 30 | | |
| 02 | 61-02 | 0 | 3.5 | 30 | 45 | | |
| 03 | 61-03 | 3.5 | 7.5 | 30 | 46 | | |
| 04 | 61-04 | 1.5 | 3.5 | 46 | 49 | | |
| 05 | 61-05 | 3.5 | 7.5 | 46 | 50 | | |
| 06 | 61-06 | 7.5 | 50 | 45 | 50 | | |
| | | | | | | | |

FIG. 6

| No. | SUB-REGION | X-LOW | X-HIGH | Y-LOW | Y-HIGH | Z-LOW | Z-HIGH | OVERLAP |
|---|---|---|---|---|---|---|---|---|
| 1 | 81-1 | 0 | 5 | 0 | 5 | | | 01 |
| 2 | 81-2 | 5 | 45 | 0 | 5 | | | |
| 3 | 81-3 | 45 | 50 | 0 | 5 | | | |
| 4 | 81-4 | 0 | 5 | 5 | 45 | | | 01,02,03 |
| 5 | 81-5 | 5 | 45 | 5 | 45 | | | EXCLUDE |
| 6 | 81-6 | 45 | 50 | 5 | 45 | | | |
| 7 | 81-7 | 0 | 5 | 45 | 50 | | | 02,03,04,05 |
| 8 | 81-8 | 5 | 45 | 45 | 50 | | | 05,06 |
| 9 | 81-9 | 45 | 50 | 45 | 50 | | | 06 |
| | | | | | | | | |

FIG. 8

| No. | SUB-REGION | X-LOW | X-HIGH | Y-LOW | Y-HIGH | Z-LOW | Z-HIGH |
|---|---|---|---|---|---|---|---|
| 1 | 81-1 | 0 | 5 | 0 | 5 | | |
| 4 | 81-4 | 0 | 5 | 5 | 45 | | |
| 7 | 81-7 | 0 | 5 | 45 | 50 | | |
| 8 | 81-8 | 5 | 45 | 45 | 50 | | |
| 9 | 81-9 | 45 | 50 | 45 | 50 | | |
| | | | | | | | |

50

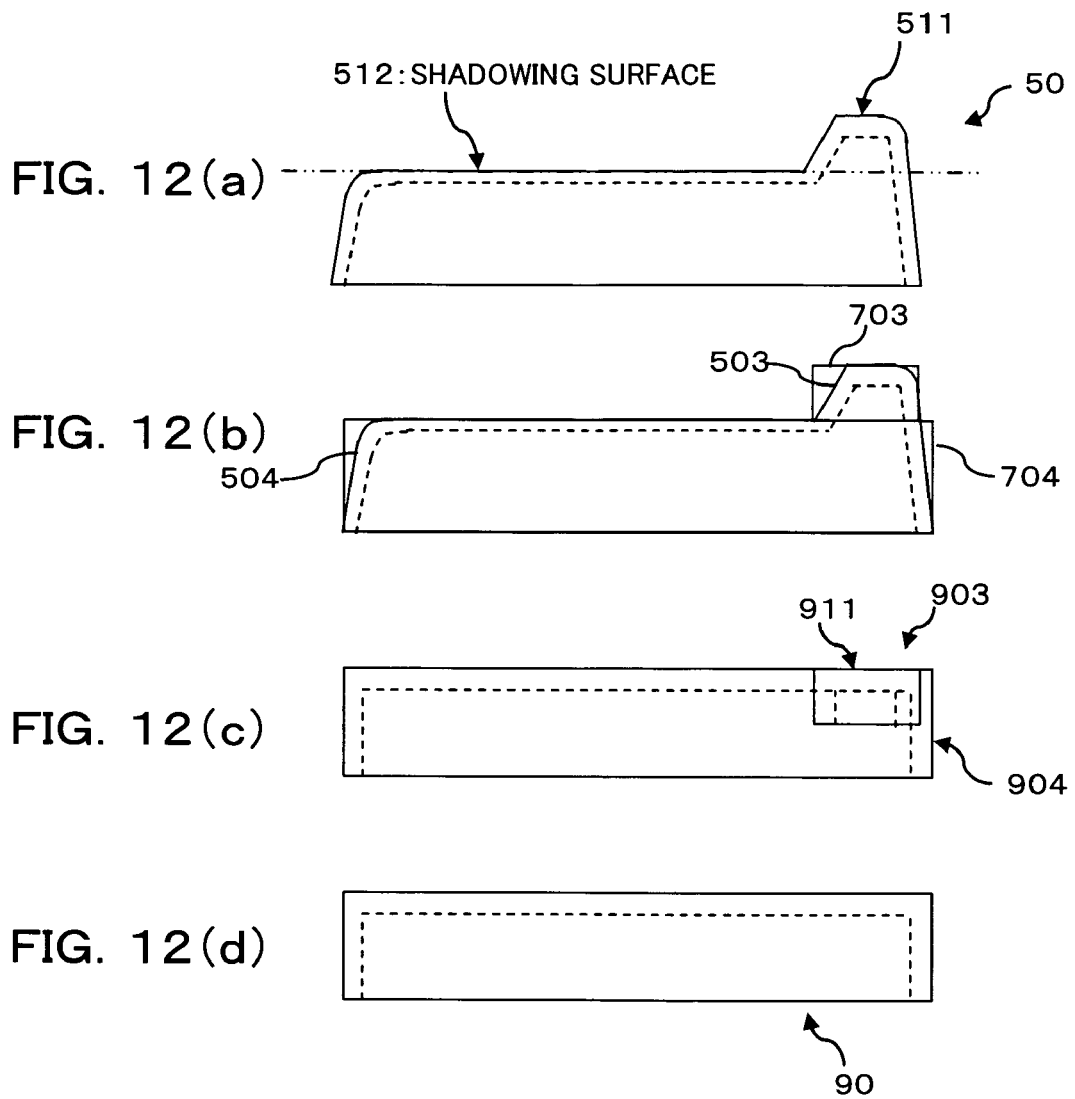

60

90

APPARATUS, AND METHOD FOR GENERATING ANALYTICAL MODEL, AND RECORDING MEDIUM IN WHICH PROGRAM FOR GENERATING ANALYTICAL MODEL IS STORED

BACKGROUND OF THE INVENTION

1. Field of the Invention

The present invention relates to a technology for generating analytical models used in numerical analysis of object shape models, and particularly relates to generation of simplified analytical models.

2. Description of the Related Art

In recent object shape design, a designing process has been effectively performed by generating an analytical model (mesh model) for numerical analysis of an object shape using modeling data (object shape data, three-dimensional CAD data) so that the time required for the generation is reduced.

For example, VPS/Simulation-HUB (manufactured by Fujitsu Ltd.) referred to in below non-Patent Reference 1 has a function for converting three-dimensional (hereinafter abbreviated to 3D) CAD data into an analytical model (a mesh structure).

FIGS. 21(a), 21(b) and 21(c) are perspective views illustrating an analytical model generated in a conventional analytical model generating method: FIG. 21(a) is a perspective view of an example of an object shape model generated by 3D CAD; FIG. 21(b) is a perspective view illustrating an example of an analytical model generated based on the object shape model of FIG. 21(a) in a conventional generating method; and FIG. 21(c) is an enlarged view illustrating a part of the analytical model of FIG. 21(b) The example of the analytical model shown in FIGS. 21(b) and 21(c) takes the form of cuboid meshes (also called orthogonal meshes).

A conventional analytical model generating method generates a large number of meshes to represent a curved portion or the like as shown in FIG. 21(c). Specifically, generation of an analytical model based on modeling data generated by means of 3D CAD results in a large number of small meshes for a curved portion or a line in order to represent the shape of the modeling data in high fidelity, so that mesh information (the number of divisions) becomes large.

As a consequence, an analytical model of a mobile telephone or a laptop computer, whose surface has many curved portions due to a design aspect, tends to be large in data scale.

For example, the analytical model of FIGS. 21(b) and 21(c) is large in scale with more than 50 million meshes. [Non-Patent Reference] UEDA, Akira URAKI, Yasushi and AOKI, Kenichiro: "High-Speed Modeling of VPS/Simulation-HUB", FUJITSU, vol. 55, No. 3 (May 2004).

However, since it is said that analytical scale (time required for an analysis process) is proportional to the square of the number of meshes, analysis (numerical analysis) using solver (an analytical tool) is not practically performed on a large-scale analytical model generated in the conventional method in view of limitations on performance of a computer. For this reason, minor changes in the shape of an analytical model are unavoidable.

As an example of the solution to the above problem, concerning the analytical model shown in FIGS. 21(b) and 21(c), the analytical model has to be manually simplified to reduce the number of meshes to about 5 million, which is a practically analyzable scale, so that the analytical model can be subjected to analysis.

Conventionally, simplification of such an analytical model has been performed by an operator using the analytical model, in which detailed meshes have been generated as shown in FIG. 21(b), as a template, and then modifying the shape. The simplification process of an analytical model has therefore been complex and a burden to the operator.

For example, the above VPS/Simulation-HUB has a function for removing minute parts and non-analysis object parts which do not affect the results of analysis using an object shape model in order to inhibit an increase in the mesh number. With this function, the number of meshes to be generated can be reduced by removal of unnecessary parts, which is smaller than the size designated by a user. In addition to the function, the art demands a technique to simplify an analytical model more effectively.

SUMMARY OF THE INVENTION

With the foregoing problems in view, the object of the present invention is to reduce the time required for numerical analysis and to realize an effective designing process by generating a simplified analytical model with ease.

To attain the above object, as a first generic feature, there is provided an apparatus for generating an analytical model of an object shape model, the analytical model being used for numerical analysis, comprising: a detail-mesh-model generating section which generates a detail mesh model of the object shape model based on the object shape model; a maximum outer shape mesh model generating section which generates a maximum outer shape mesh model corresponding to an outline of the object shape model based on the object shape model; a wall-thickness-region generating section which generates a basic wall-thickness region, which extends inside the maximum outer shape mesh model from at least a part of surfaces of the maximum outer shape mesh model and which has a predetermined thickness; and an overlaying section which generates the analytical model by using a result of overlaying the detail mesh model with the basic wall-thickness region.

As a preferable feature, the overlaying section may generate the analytical model by dividing the basic wall-thickness region into a plurality of sub-regions and combining one or more of the plural sub-regions which overlap the detail mesh model.

As another preferable feature, the apparatus may further comprise a wall-thickness inputting section which inputs a thickness of the basic wall thickness region, and the wall-thickness-region generating section may regard the thickness input from the wall-thickness inputting section as the predetermined thickness.

As an additional preferable feature, the apparatus may further comprise an object shape model dividing section which divides the object shape model into a number of segments, and the detail-mesh-model generating section may generate the detail mesh model of each of the segments based on each of the segments; the maximum outer shape mesh model generating section may generate the maximum outer shape mesh model corresponding to an outline of each of the segments based on each of the segments; the wall-thickness generating section may generate the basic wall-thickness region for each of the segments; the overlaying section may generate the analytical model of each of the segments; and the apparatus may further comprise a binding section which binds the analytical model of each of the segments which model has been generated by the overlaying section so that the first analytical model corresponding to the object shape model is generated.

As a further preferable feature, the apparatus may further comprise a shadowing surface assignment-inputting section for inputting, if the object shape model has a projection which protrudes from of a surface of the object shape model, assignment to the surface as a shadowing surface that is to be used as a reference to shadow the projection, and the analytical model may be generated regarding the shadowing surface assigned by the shadowing surface assignment-inputting section as an outer surface of the analytical model.

As a second generic feature, there is provided a method for generating an analytic model of an object shape model, the analytical model being used for numerical analysis, comprising the steps of: (a) generating a detail mesh model of the object shape model based on the object shape model; (b) generating a maximum outer shape mesh model corresponding to an outline of the object shape model based on the object shape model; (c) generating a basic wall-thickness region, which extends inside the maximum outer shape mesh model from at least a part of surfaces of the maximum outer shape mesh model and which has a predetermined thickness; and (d) generating the analytical model by using a result of overlaying the detail mesh model with the basic wall-thickness region.

As a preferable feature, the step (d) of generating may comprise the sub-steps of: (d-1) dividing the basic wall-thickness region into a plurality of sub-regions; and (d-2) combining one or more of the plural sub-regions which overlap the detail mesh model.

As another preferable feature, the method may further comprise the step of inputting a thickness of the basic wall thickness region, and the thickness assigned in the step of inputting may be regarded as the predetermined thickness of the basic wall-thickness region.

As an additional preferable feature, the method may further comprise the step of dividing the object shape model into a number of segments, the detail mesh model of each of the segments may be generated based on each of the segments in step (a), the maximum outer shape mesh model of each of the segments may be generated based on each of the segments in step (b), the basic wall-thickness region for each of the segments may be generated in step (c), the analytical model of each of the segments may be generated in step (d), and the method may further comprise the steps of binding the analytical model of each of the segments which model has been generated in step (d) so that the first analytical model corresponding to the object shape model is generated.

As a further preferable feature, the method may further comprise the steps of, if the object shape model has a projection which protrudes from a surface of the object shape model, inputting assignment to the surface as a shadowing surface that is to be used as a reference to shadow the projection, and the analytical model may be generated regarding the shadowing surface assigned in the step of inputting as an outer surface of the analytical model.

As a third generic feature, there is provided a program for generating an analytical model of an object shape model, the analytical model being used for numerical analysis, wherein the program instructs a computer to function as: a detail-mesh-model generating section which generates a detail mesh model of the object shape model based on the object shape model; a maximum outer shape mesh model generating section which generates a maximum outer shape mesh model corresponding to an outline of the object shape model based on the object shape model; a wall-thickness-region generating section which generates a basic wall-thickness region, which extends inside the maximum outer shape mesh model from at least a part of the surfaces of the maximum outer shape mesh model and which has a predetermined thickness; and an overlaying section which generates the analytical model by using a result of overlaying the detail mesh model with the basic wall-thickness region.

As a preferable feature, the program may instruct the computer to generate the analytical model by dividing the basic wall-thickness region into a plurality of sub-regions and combining one or more of the plural sub-regions which overlap the detail mesh model so that the program instructs the computer to function as the overlaying section.

As another preferable feature, the program may further instruct the computer to function as a wall-thickness inputting section which inputs a thickness of the basic wall thickness region, and when the program instructs the computer to function as the wall-thickness-region generating section, the thickness input from the wall-thickness inputting section may be regarded as the predetermined thickness.

As an additional preferable feature, the program may instruct the computer to function as: the detail-mesh-model generating section generating the detail mesh model of each of the segments based on each of the segments; the maximum outer shape mesh model generating section generating the maximum outer shape mesh model corresponding to an outline of each of the segments based on each of the segments; the wall-thickness generating section generating the basic wall-thickness region for each of the segments; and the overlaying section generating the analytical model of each of the segments, and the program further instructs the computer to function as a binding section which binds the analytical model of each of the segments which model has been generated by the overlaying section so that the first analytical model corresponding to the object shape model is generated.

As a further preferable feature, the program may instruct the computer to function as a shadowing surface assignment section for inputting, if the object shape model has a projection which protrudes from a surface of the object shape model, assignment to the surface as a shadowing surface that is to be used as a reference to shadow the projection, and the program may instruct the computer to generate the analytical model regarding the shadowing surface assigned by the shadowing surface assignment-inputting section as an outer surface of the analytical model.

As a fourth generic feature, there is provided a computer-readable recording medium in which the program for generating an analytical model which program has one or more of the above features is stored.

The present invention ensures one or more of the following advantages:

(1) a simplified analytical model can be generated with ease and generation of an analytical model takes less time;

(2) an inhibited scale of an analytical model can reduce the time required for analysis performed in a downstream analytical tool;

(3) the present invention can reduce time required for the entire process of analysis, and can be effectively used for quality judgment of an object shape model, judgment and decision of design plan at an early stage of the upstream design process, for example;

(4) the present invention can minimize differences among shapes of the object shape model, the maximum outer shape mesh model and the analytical model concerning a complex object shape model, so that accuracy of downstream analysis performed by the analytical tool can be improved; and (5) a projection which is judged to slightly affect the analysis result can be easily and rapidly excluded from the analytical model, so the present invention also provides a high level of convenience.

Other objects and further features of the present invention will be apparent from the following detailed description when read in conjunction with the accompanying drawings.

BRIEF DESCRIPTION OF THE DRAWINGS

FIGS. 4(a), 4(b) and 4(c) are diagrams explaining a process performed by an overlaying section of the analytical model generating apparatus of FIG. 1;

FIG. 5 is a table showing the shape (size) and the position of each of the meshes constituting the detail mesh model shown in FIG. 4(b);

FIG. 6 is a table showing the shape (size) and the position of each sub-region shown in FIG. 4(c);

FIG. 8 is a table showing the shape (size) and the position of each sub-region constituting the analytical model of FIG. 7;

FIGS. 12(a), 12(b), 12(c) and 12(d) are diagrams showing a method for simplification of an analytical model by shadowing assignment on an object shape model in the analytical model generating apparatus of FIG. 1;

DESCRIPTION OF THE PREFERRED EMBODIMENTS

A preferred embodiment of the present invention will now be described with reference to the accompanying drawings.

Figure 1:
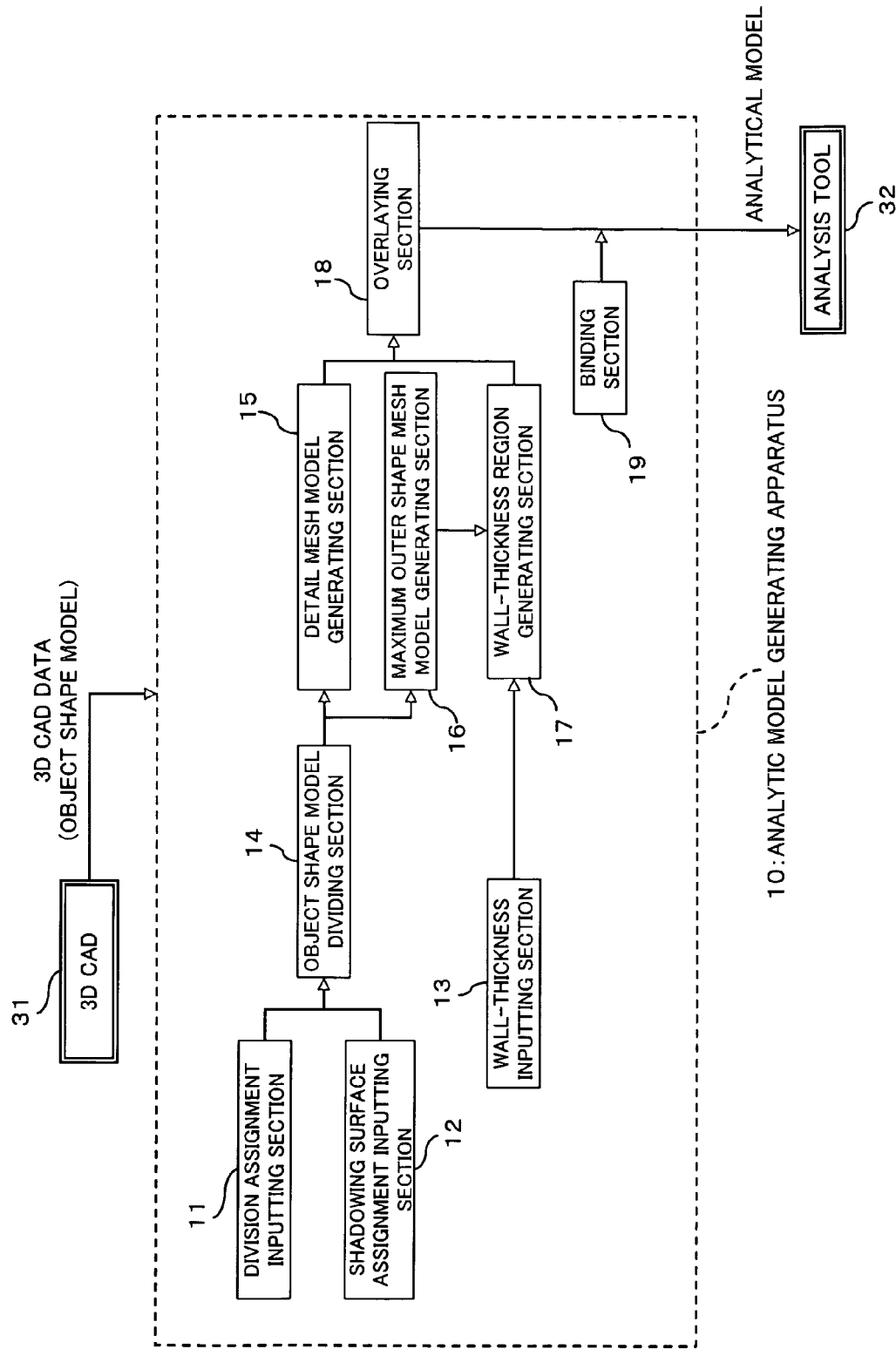
FIG. 1 is a block diagram schematically showing an analytical model generating apparatus according to an embodiment of the present invention.

FIG. 1 schematically shows an analytical model generating apparatus according to an embodiment of the present invention.

The analytical model generating apparatus 10 generates an analytical model that is to be used for numerical analysis of an object shape model, and more specifically generates a simplified analytical model based on the three-dimensional (hereinafter abbreviated to 3D) CAD (Computer Aided Design) data (an object shape model) generated by 3D CAD 31 or the like.

An analytical model generated by the analytical model generating apparatus 10 is sent to an analytical tool 32, such as solver, which executes various analyses using the generated analytical model.

The analytical model generating apparatus 10 of the present invention is preferably used for generating an analytical model of an object shape model formed by combining board members having a particular thickness such as cases of mobile phones and laptop computers, and is more preferably used for generating an analytical model of an object shape model with a hollow (i.e., a box shape).

The 3D CAD 31 generates a 3D model (modeling data) of an object shape model using information about the design object shape on a computer, and various 3D CAD 31s are known to the art. In the present embodiment, the 3D CAD 31 is not limited to a particular program or product, and an object shape model is also not limited to a particular data format.

An object shape model generated by the 3D CAD 31 is sent to the analytical model generating apparatus 10 through communication means such as LAN (Local Area Network), through a recording medium such as a memory or a magnetic disk, or in various other manners. A method for sending an object shape model to the analytical model generating apparatus 10 should by no means be limited to a particular method.

The analytical tool 32 carries out various analyses (arithmetic operations) based on an analytical model generated by the analytical model generating apparatus 10, and analyses are exemplified by a thermal hydraulic analysis and an electromagnetic analysis in the present embodiment.

Figure 2:
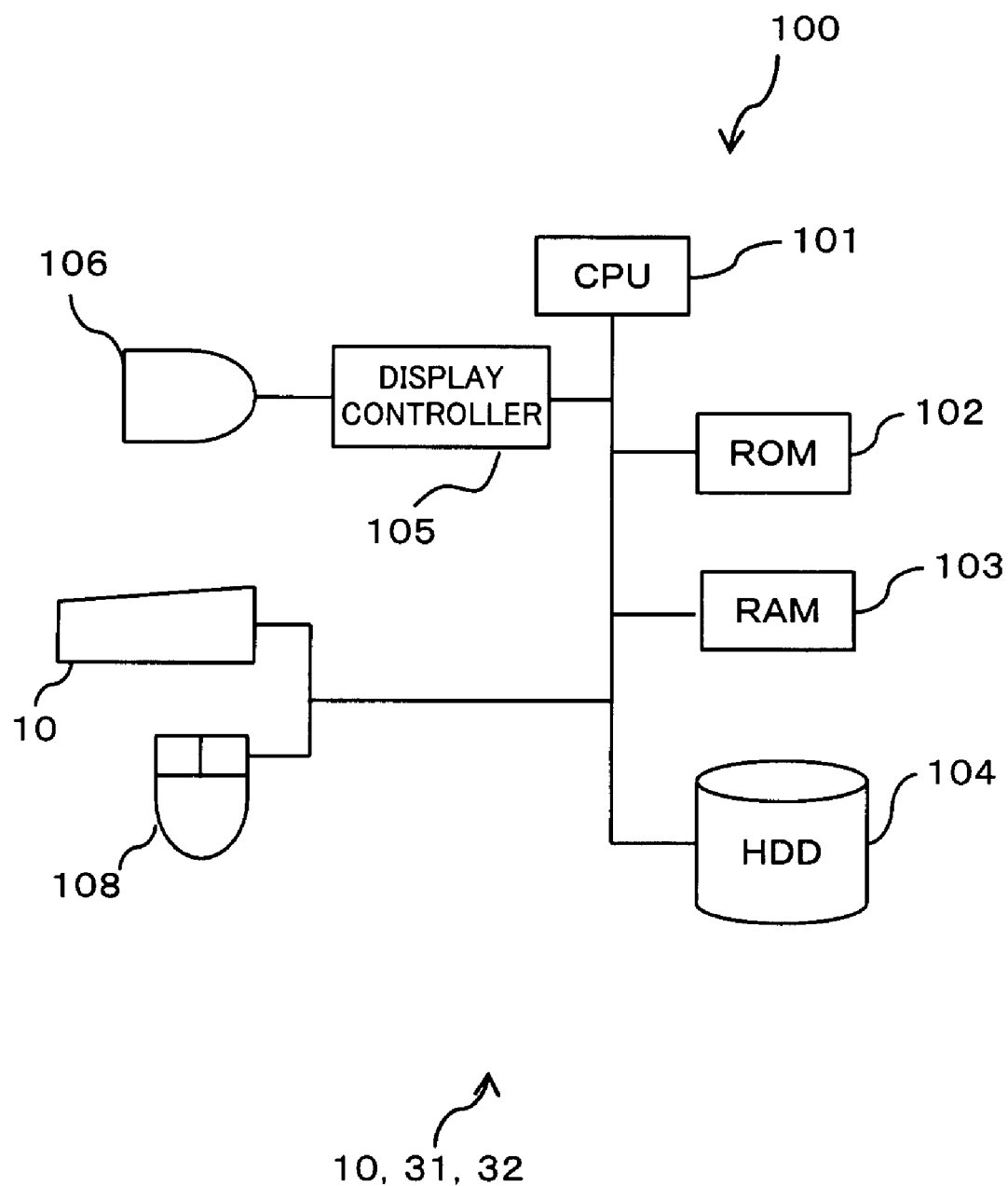
FIG. 2 is a block diagram schematically showing a hardware configuration of an information processor (a computer system) that functions as the analytical model generating apparatus of FIG. 1.

FIG. 2 schematically shows a hardware configuration of an information processor (a computer system) that functions as analytical model generating apparatus 10 of the present embodiment. The analytical model generating apparatus 10 is realized by the information processor 100 of FIG. 2.

As shown in FIG. 2, the information processor 100 includes a CPU (Central Processing Unit) 101, a ROM 102, a RAM 103, a HDD (Hard Disk Drive) 104, a display controller 105, a monitor 106, a keyboard 107, and a mouse 108.

The CPU of the information processor 100 executes an analytical model generating program to function as an object shape model dividing section 14, a detail-mesh-model generating section 15, a maximum outer shape mesh model generating section 16, a wall-thickness-region generating section 17, an overlaying section 18 and a binding section 19 that are detailed below. Further, the information processor 100 may function also as the 3D CAD 31 by executing a program.

Such a program (an analytical model generating program), which realizes the functions of the object shape model dividing section 14, the detail-mesh-model generating section 15, the maximum outer shape mesh model generating section 16, the wall-thickness-region generating section 17, the overlaying section 18 and the binding section 19 is provided in the form of being recorded in a computer-readable recording medium exemplified by a flexible disk, a CD (such as CD-ROM, CD-R, CD-RW), a DVD (such as DVD-ROM, DVD-RAM, DVD-R, DVD+R, DVD-RW, DVD+RW), a magnetic disk, an optical disk, or a magneto-optical disk. In this case, the computer reads the creation program from the recording medium and sends the read program to be stored in an internal or external memory for future use. Alternatively, the program may be previously recorded in a storage (a recording medium) exemplified by a magnetic disk, an optical disk or a magnet-optical disk, and provided to a computer from the storage through a communication path.

The functions as the object shape model dividing section 14, the detail-mesh-model generating section 15, the maximum outer shape mesh model generating section 16, the wall-thickness-region generating section 17, the overlaying section 18 and the binding section 19 are realized by a microprocessor (the CPU 101 in the present embodiment) executing the program stored in an internal memory (the ROM 103 or the RAM 102 of the information processor 100 in the present embodiment). Alternatively, the computer may read the program from a recording medium and execute the read program, at that time.

The concept of a computer in this embodiment includes hardware and an OS (Operating System), and means hardware that operates under control of the OS. If an application program independently operates hardware, requiring no OS, the hardware itself corresponds to a computer. Hardware includes at least a microprocessor such as a CPU and means for reading a computer program recorded in a recording medium. In the present embodiment, the information processor 100 has the function of a computer.

Further, the recording medium used in this embodiment may be one from various computer-readable recording mediums such as an IC card, a ROM cartridge, a magnetic tape, an internal memory (such as a RAM or a ROM) in a computer, an external memory, other than the above examples of a flexible disk, a CD, a DVD, a magnetic disk, an optical disk and a magneto-optical disk.

The analytical model generating apparatus 10 includes a division assignment-inputting section 11, a shadowing surface assignment section 12, a wall-thickness inputting section 13, the object dividing section 14, the detail-mesh-model generating section 15, the maximum outer shape mesh model generating section 16, the wall-thickness-region generating section 17, the overlaying section 18 and the binding section 19, as shown in FIG. 1.

The detail-mesh-model generating section 15 generates a detail mesh model of an object shape model based on the object shape model generated by the 3D CAD 31.

FIGS. 3(*a*), 3(*b*), 3(*c*), 3(*d*) and 3(*e*) are diagrams explaining an analytical model generated by the analytical model generating apparatus 10: FIG. 3(*a*) is a side view illustrating an example of an object shape model; FIG. 3(*b*) is a side view illustrating an example of a detail mesh model generated based on the object shape model of FIG. 3(*a*); FIG. 3(*c*) is a side view illustrating an example of a maximum outer shape mesh model generated based on the object shape model of FIG. 3(*a*); and FIG. 3(*d*) is a side view illustrating an example of a basic wall-thickness region generated based on the maximum outer shape mesh model of FIG. 3(*c*); and FIG. 3(*e*) is a side view illustrating an analytical model generated by the analytical model generating apparatus 10.

These FIGS. 3(*a*), 3(*b*), 3(*c*), 3(*d*) and 3(*e*) respectively show a state (a side view) seen from one face of an object shape model 50, a detail mesh model 60, a maximum outer shape mesh model 70, a basic wall-thickness region 80, and an analytical model 90, which actually have three dimensional shapes and omit the shapes in the depth direction relative to the drawing sheet for convenience.

The detail-mesh-model generating section 15 divides the object shape model (see FIG. 3(*a*)) generated by the 3D CAD 31 into a number of segments and generates analytical meshes for numerical analysis based on the object shape model. More specifically, on the basis of the object shape model 50, the detail-mesh-model generating section 15 generates a detail mesh model 60 (see FIG. 3(*b*)) in the form of a combination of a number of meshes (cuboids; hereinafter called orthogonal meshes in the present specification).

The detail mesh model 60 generated by the detail-mesh-model generating section 15 is formed by orthogonal meshes 61 which vary with size so as to represent the object shape model 50 with high fidelity, as shown in FIG. 3(*b*). In particular, a great number of orthogonal meshes 61 small in size are generated for a portion corresponding to a curved portion of the object shape model 50.

The detail-mesh-model generating section 15 can generate the orthogonal meshes 61 by using any method previously known.

The maximum outer shape mesh model generating section 16 generates a maximum outer shape mesh model 70 corresponding to the outline of the object shape model 50 generated by the 3D CAD 31 based on the object shape model 50.

Specifically, the maximum outer shape mesh model generating section 16 checks the maximum outer shape of the object shape model, and generates the maximum outer shape mesh model 70 (see FIG. 3(*c*)) corresponding to the outline (which contains the maximum outer shape or which is identical in shape to the maximum outer shape) of the object shape model.

The wall-thickness-region generating section 17 generates the basic wall-thickness region 80 which extends inside the maximum outer shape mesh model 70 from at least a part of the surfaces of the maximum outer shape mesh model 70 and which has a predetermined thickness.

Specifically, the wall-thickness-region generating section 17 generates a region by moving each surface of the maximum outer shape mesh model 70 inside the mesh model 70 parallel as far as a predetermined thickness (represented by "t" in the example of FIG. 3(*d*)), and regards the generated region as the basic wall-thickness region 80. The basic wall-thickness region 80 generated in the above manner that has the predetermined thickness (wall thickness) may be a region which has a hollow in the shape of a rectangular prism similar in shape to the maximum outer shape mesh model 70.

Alternatively, the wall-thickness-region generating section 17 may generate the basic wall-thickness region 80 by moving at least a part (e.g., surface 71 and 72 in FIG. 3(*c*)) of the surfaces of the maximum outer shape mesh model 70 inside the mesh model 70 as far as a predetermined thickness ("t" in the example of FIG. 3(*d*)). The example of FIG. 3(*d*) shows the basic wall-thickness region 80 generated by moving the surface 71 and 72 of FIG. 3(*c*) parallel.

A wall-thickness inputting section 13 enables an operator or the like to input a wall thickness of a basic wall-thickness region and is realized by the keyboard 107, the mouse 108, and others. A value input via the wall-thickness inputting section 13 is stored in the RAM 103, the HDD 104 or the like and is used as a predetermined thickness ("t" in the example of FIG. 3(d)) by the wall-thickness-region generating section 17.

Figure 3A:
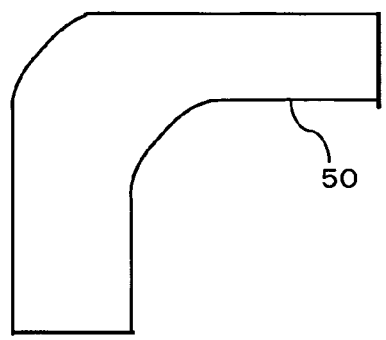
FIGS. 3(a), 3(b), 3(c), 3(d) and 3(e) are diagrams explaining an analytical model generated by the analytical model generating apparatus of FIG. 1.
Figure 3B:
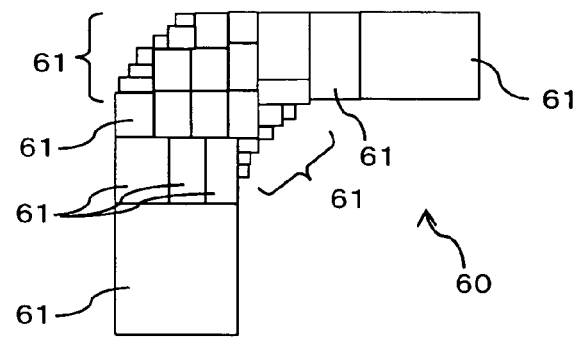
Figure 3C:
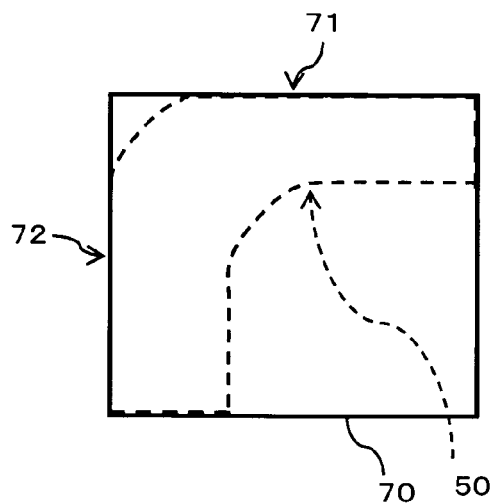
Figure 3D:
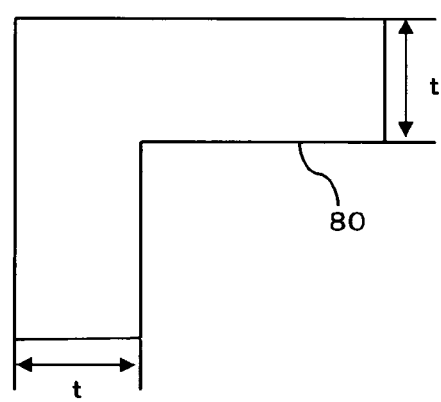
Figure 3E:
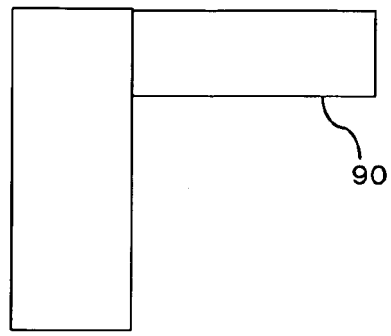

The overlaying section 18 overlays the detail mesh model 60 generated by the detail-mesh-model generating section 15 with the basic wall-thickness region 80 generated by the wall-thickness-region generating section 17, and generates the analytical model 90 (see FIG. 3(e)) by using the result of the overlaying. The overlaying section 18 divides the basic wall-thickness region generated by the wall-thickness-region generating section 17 into a number of sub-regions, and combines one or more sub-regions which overlap the detail mesh model 60 to generate the analytical model 90.

Here, description will now be made concerning a method for generating an analytical model 90 performed by the binding section 18 in the analytical model generating apparatus 10 with reference to FIGS. 4(a), 4(b), 4(c), and 5-8.

FIGS. 4(a), 4(b), and 4(c) are diagrams explaining a process performed by the overlaying section 18 of the analytical model generating apparatus 10 in the present embodiment. FIG. 4(a) is a side view illustrating an example of an object shape model; FIG. 4(b) is a diagram illustrating an example of a detail mesh model generated based on the object shape model of FIG. 4(a); and FIG. 4(c) is a diagram illustrating an example of a number of sub-regions generated by the overlaying section 18.

For simple explanation, FIG. 4(b) simplifies a part of meshes included in the detail mesh model. The simplification should be recognized by comparison with the detail mesh model 60 shown in FIG. 3(b), for example. Each orthogonal mesh and each sub-region are actually rectangular prisms, but FIGS. 4(a), 4(b), and 4(c) omit information of the Z-axial direction (the depth direction relative to the drawing sheet) for convenience.

Figure 7:
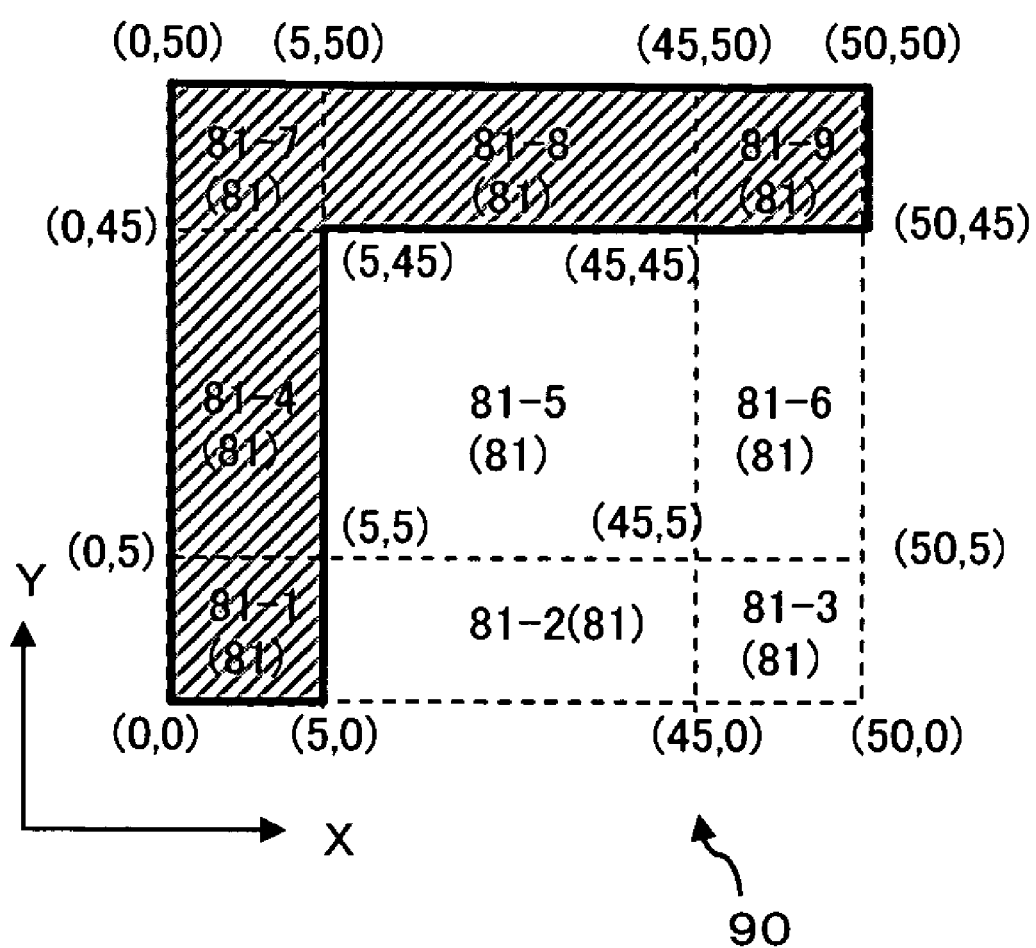
FIG. 7 is a side view illustrating the shape of an analytical model generated by the analytical model generating apparatus of FIG. 1.

FIG. 5 is a table showing the shape (size) and the position of each of the meshes constituting the detail mesh model shown in FIG. 4(b); FIG. 6 is a table showing the shape (size) and the position of each of the sub-regions shown in FIG. 4(c); FIG. 7 is a side view illustrating a shape of an analysis model generated in the analytical model generating apparatus 10; and FIG. 8 is a table showing the shape (size) and the position of each of the sub-segments constituting the analytical model shown in FIG. 7.

For example, description will be made in relation to a case of generating an analytical model 90 of an object shape model 50 which has an L-shaped section and a wall thickness of 5 mm as shown in FIG. 4(a). The detail-mesh-model generating section 15 generates the detail mesh model 60 shown in FIG. 4(b) based on the object shape model object shape 50.

The detail mesh model 60 is formed by combining orthogonal meshes 61 to approximately represent the object shape model 50 shown in FIG. 4(a), and includes orthogonal meshes 61-01, 61-02, 61-03, 61-04, 61-05, and 61-06. Hereinafter, one of the orthogonal meshes constituting the detail mesh model 60 of FIG. 4(b) is specified by a reference number from 61-01 to 61-06, but an arbitrary orthogonal mesh is represented by a reference number 61.

The positions and the sizes of the orthogonal meshes 61-01, 61-02, 61-03, 61-04, 61-05, and 61-06 can be expressed by a table (orthogonal mesh information) of FIG. 5, which table is stored in a storage unit such as the HDD 104 or the RAM 103 in the present analytical model generating apparatus 10.

The field on the column "No." in the table of FIG. 5 represents a number to specify each orthogonal mesh 61 and corresponds to each number below the hyphen of 61-01 through 61-06. Values in the table FIG. 5 represent coordinates of each orthogonal mesh 61 when the lower left apex of orthogonal mesh 61-01 in FIG. 4(b) is assumed to be the origin (0, 0, 0) and more specifically represent X, Y and Z coordinates of the surfaces constituting each of orthogonal meshes 61. For simplification, the example of FIG. 5 also omits information concerning Z coordinates.

For example, the orthogonal mesh 61-01 can be regarded as rectangular, and whose apexes are represented by the X, Y-coordinates (0, 0), (5, 0), (5, 30) and (0, 30). That means the orthogonal mesh 61-01 is a region enclosed by lines X=0, X=5, Y=0 and Y=30.

FIG. 4(c) attaches dashes "'" to reference numbers of surfaces generated as a result of parallel translation of the corresponding surfaces 71-74 constituting the maximum outer shape mesh model 70 inside the maximum outer shape mesh model as far as a predetermined thickness (t=5 mm in the example of FIG. 4(c)). FIG. 4(c) also attaches reference numbers 81-1, 81-2, 81-3, 81-4, 81-5, 81-6, 81-7, 81-8, and 81-9 to regions divided by the surfaces 71-74 constituting the maximum outer shape mesh model 70 and surfaces 71'-74' generated by moving the surfaces 71-74 parallel. Hereinafter, one of the regions in FIG. 4(c) is specified by a reference number from 81-1 to 81-9, but an arbitrary region is represented by a reference number 81.

The positions and sizes of the regions 81-1, 81-2, 81-3, 81-4, 81-5, 81-6, 81-7, 81-8, and 81-9 take the form of a table (region information) as shown in FIG. 6, which table is stored in a storage unit such as the HDD 104 or the RAM 103 in the analytical model generating apparatus 10.

The field on the column "No." in the table of FIG. 6 represents a number to specify a region 81 and corresponds to each number below the hyphens of 81-1 through 81-9. Values in the table FIG. 6 represent coordinates of each region 81 when the lower left apex of the region 81-1 is assumed to be the origin (0, 0, 0) and more specifically represent X, Y and Z coordinates of the surfaces constituting each region 81. For simplification, also the example of FIG. 6 omits information concerning Z coordinates.

For example, the region 81-1 can be regarded as rectangular, and whose apexes are represented by the X and Y-coordinates (0, 0), (5, 0), (5, 5) and (0, 5). That means the region 81-1 is a region enclosed by lines X=0, X=5, Y=0 and Y=5.

The combination of the regions 81-1, 81-2, 81-3, 81-4, 81-6, 81-7, 81-8, and 81-9 in FIG. 4(c) corresponds to the basic wall-thickness region generated by the wall-thickness-region generating section 17, and therefore each of the above regions can be regarded as the sub-regions.

The overlaying section 18 overlays the detail mesh model 60 shown in FIG. 4(b) with the basic wall-thickness region 80 shown in FIG. 4(c), and extracts (leaves the data concerning; performs multiplication on) one or more sub-regions 81 overlapping the detail mesh model 60 from all sub-regions constituting the basic wall-thickness region 80, so that an analytical model 90 is generated.

The overlaying section 18 is capable of specifying one or more orthogonal meshes 61 which overlap each region 81 based on the sizes and the positions of each orthogonal mesh 61 of FIG. 5 and those of each region 81 of FIG. 6.

In FIG. 6, a field on the "overlap" column represents one or more numbers specifying orthogonal meshes 61 which overlap each region 81 as a consequence of the above-mentioned overlaying. The example shown in FIG. 6 shows that the region 81-1 overlaps the orthogonal mesh 61-01; the region 81-4 overlaps the orthogonal meshes 61-01, 61-02, and 61-03; the region 81-7 overlaps the orthogonal meshes 61-02, 61-03, 61-04, and 61-05; the region 81-8 overlaps the orthogonal meshes 61-05 and 61-06; and the region 81-9 overlaps the orthogonal mesh 61-06. Further, in the example of FIG. 6, the region 81-5 corresponds to a portion void of the basic wall-thickness region 80, and is therefore excluded from overlaying objectives.

In the above manner, the analytical model 90 shown in FIG. 7 is generated by extracting only a region (one or more sub-regions) overlapping the detail mesh model 60 from the basic wall-thickness region 80 and combining the extracted region. The sizes and positions of the sub-regions 81 constituting the generated analytical model 90 can be obtained with reference to the table in FIG. 8. Specifically, the information in FIG. 8 can be obtained by extracting one or more sub-regions whose field of "overlap" in FIG. 6 has one or more orthogonal meshes 61 registered.

The analytical model generating apparatus 10 stores information in table FIG. 8, serving as information constituting the generated analytical model 90, into a storage unit such as the HDD 104 and the RAM 103.

The division assignment-inputting section 11 enables an operator to input an assignment to divide the object shape model 50 into a number of segments, and takes the form of the keyboard 107 and the mouse 108. Following a division assignment input by the operator via the division assignment-inputting section 11, the object shape model dividing section 14 divides the object shape model into a number of segments.

The division assignment is carried out by, for example, inputting and setting one or more division lines at which the object shape model 50 is to be divided in an image of the object shape model 50 displayed on the monitor 106, or inputting one or more selective regions to input a region to be divided into segments.

For example, a division line maybe a horizontal line, a vertical line or a line which has arbitrary beginning and end points. If a division line is a horizontal or vertical line, it is preferable that the operator inputs a position through which the line passes via the division assignment-inputting section 11. If a division line is an arbitrary line, it is preferable that the operator inputs beginning and end points via the division assignment-inputting section 11.

A selective region may be a rectangular shape (see FIG. 17), and the operator may designate the positions of opposite angles of the rectangle by sequentially inputting the positions via the division assignment-inputting section 11. Alternatively, a selective region may be an arbitrary shape other than a rectangle, and in this case, the operator can designate the shape by sequentially inputting the positions of outlines (passing points) of the region via the division assignment-inputting section 11.

In the present embodiment, drawing in the Z-axial direction is omitted on the image displayed on the monitor 106 and others. Needless to say, two-dimensional information of a division line or region is however input as a divisional assignment on the monitor 16, but the input information is regarded as information also concerning the Z axis.

The object shape model dividing section 14 divides the object shape model 50 into a number of segments in accordance with a divisional assignment (division positions) which has been input through the division assignment-inputting section 11. The method for dividing the object shape mode 150 by the object shape model dividing section 14 can be any known manner.

In the present embodiment, the object shape model 50 is assumed to be divided into two segments 501 and 502 (see FIG. 10), but the number of segments should by no means be limited to two and may be three or more.

Figure 9:
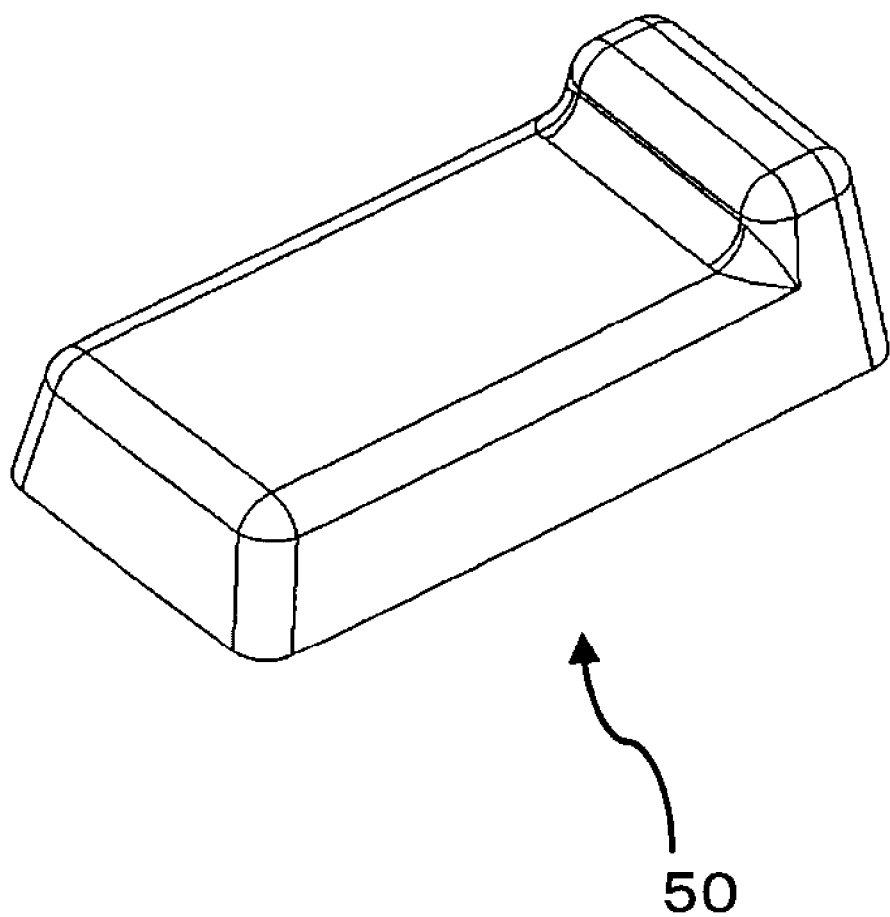
FIG. 9 is a perspective view illustrating an example of a complex object shape model.
Figure 10:
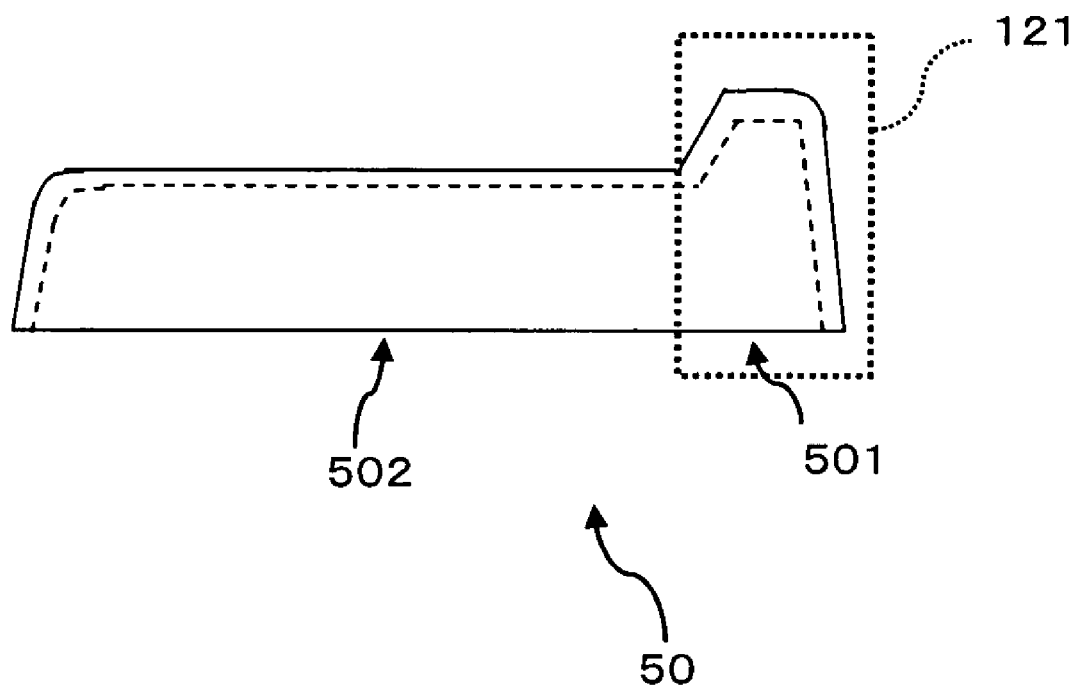
FIG. 10 is a diagram showing an example of division of an object shape model by the analytical model generating apparatus of FIG. 1.

FIG. 9 is a perspective view showing an example of a complex object shape model 50; FIG. 10 is a diagram showing an example of dividing an object shape model 50 in the analytical model generating apparatus 10 and more specifically showing an example of dividing the object shape model 50 of FIG. 9 into two segments 501 and 502. For convenience, FIG. 10 also omits information concerning the Z-axial direction (the depth direction relative to the drawing sheet).

Figure 11A:
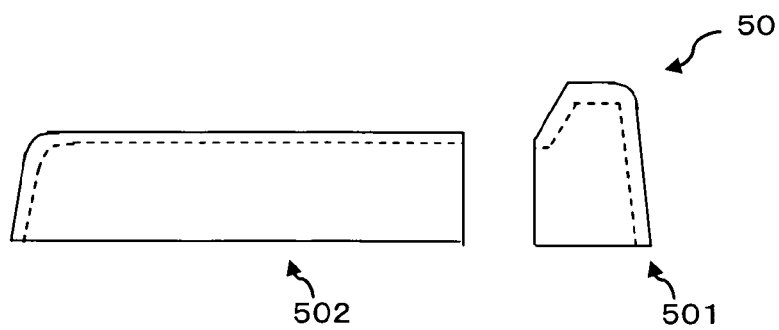
FIGS. 11(a), 11(b), and 11(c) are diagrams illustrating a method for generating an analytical model of segments into which the object shape model is divided in the analytical model generating apparatus of FIG. 1.
Figure 11B:
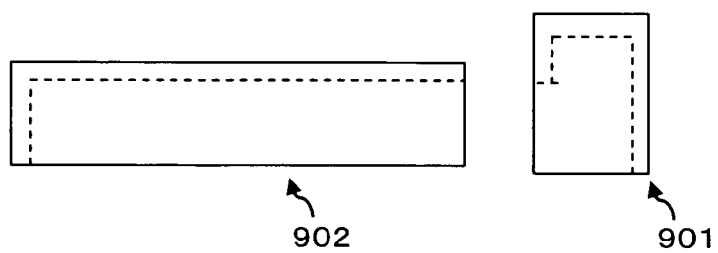
Figure 11C:
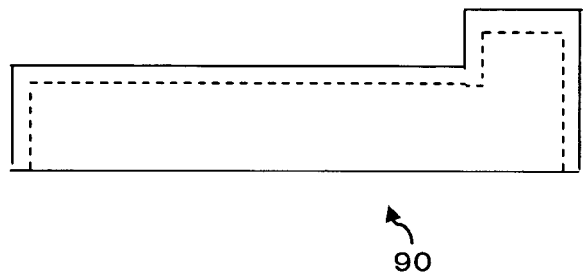

In the example of FIG. 10, a projection of the object shape model 50 is enclosed by a rectangular region 121 so that the object shape model 50 is divided into the segment 501 enclosed by the rectangular region 121 and the segment 502 that is the remaining object shape model 50. FIGS. 11(a), 11(b) and 11(c) are diagrams explaining a method for generating an analytical model 90 of the divided object shape model 50 in the analytical model generating apparatus 10. Specifically, FIG. 11(a) shows an example of the object shape model 50 divided into the segment 501 and 502; FIG. 11(b) shows segment analytical models 901 and 902 generated based on the segments 501 and 502 of FIG. 11(a), respectively; and FIG. 11(c) shows an example of a generated analytical model 90. For convenience, FIGS. 11(a), 11(b) and 11(c) omit information concerning the Z-axial direction (the depth direction relative to the drawing sheets).

In the analytical model generating apparatus 10, if the object shape model 50 is divided into segments 501 and 502 by the object shape model dividing section 14, the detail-mesh-model generating section 15 generates detail mesh models (not shown), corresponding one to each of the segments 501 and 502, based on the segments 501 and 502, respectively, in the above manner. In the below description, a detail mesh model corresponding to a segment is sometimes called a segment detail mesh model.

In the same manner, the maximum outer shape mesh model generating section 16 generates maximum outer shape mesh models (not shown), corresponding one to each of the segments 501 and 502, based on the segments 501 and 502, respectively, in the above manner. In the below description, a maximum outer shape mesh model corresponding to a segment is sometimes called a segment maximum outer shape mesh model.

On the basis of each segment maximum outer shape mesh model, the wall-thickness-region generating section 17 generates a basic wall-thickness region (not shown) corresponding to the segment maximum outer shape mesh model in the same manner described above. In other words, the wall-thickness-region generating section 17 generates basic wall-thickness regions, corresponding one to each of the segments. In the below description, a basic wall-thickness region corresponding to a segment maximum outer shape mesh model is sometimes called a segment basic wall-thickness region.

For each of the segment 501 and 502, the overlaying section 18 overlays the segment detail mesh model with the corresponding basic wall-thickness region, and generates each of the analytical models 901 and 902 by using the result of the overlaying. That is, the overlaying section 18 generates an analytical model of each segment. In the below description, an analytical model corresponding to a segment is sometimes called a segment analytical model.

In the example shown in FIGS. 11(a) and 11(b), the segment analytical model 901 is generated based on the segment 501 and the segment analytical model 902 is generated based on the segment 502.

The binding section 19 binds the analytical models (the segments' analytical models) generated by the overlaying section 18, and specifically binds the segment analytical models 901 and 902 shown in FIG. 11(b) to generate a single analytical model 90. Binding of the segment analytical models 901 and 902 by the binding section 19 can be carried out using any known method.

The shadowing surface assignment-inputting section 12 assigns, if an object shape model 50 has a projection which protrudes from a surface of the object shape model 50 and an analysis will neglect the projection, the surface as a shadowing surface that is to be used as a reference to shadow the projection, and takes the form of the keyboard 107 or the mouse 108. Following a shadowing assignment input by the operator via the shadowing surface assignment-inputting section 12, an analytical model 90 of the object shape model 50 is generated assuming that the assigned shadowing surface is an outer surface of the analytical model 90.

More specifically, in order to bind a number of segment analytical models, the binding section 19 judges the largeness of these segment analytical models and embeds the smaller segment analytical model in the larger segment analytical model to move (offset) the data of the smaller segment analytical model so that the surface (surface 911 in FIG. 12(c)) from which the smaller segment analytical model protrudes becomes identical to the shadowing surface (surface 512 in FIG. 12(a)). As a consequence, the analytical model 90 is generated such that the assigned shadowing surface serves as an outer surface of the analytical model 90.

The above procedure can avoid formation of a hole on the analytical model 90 caused by simply removing the segment analytical model 903 (which protrudes from the shadowing surface 911) from the analytical model 90.

FIGS. 12(a), 12(b), 12(c) and 12(d) are diagrams explaining a method for simplifying an analytical model 90 by shadowing assignment to an object shape model 50 in the analytical model generating apparatus 10 of the present embodiment. FIG. 12(a) shows an example of a shadowing surface of an object shape model 50; FIG. 12(b) shows an example of segments 503 and 504 which is generated by dividing the object shape model 50 at the shadowing surface 50 of FIG. 12(a) and segment detail mesh models 703 and 704 corresponding to the segments 503 and 504, respectively; FIG. 12(c) shows a state in which the segment detail mesh model 903 that is a part of the detail mesh model has been offset; and FIG. 12(d) shows an example of a generated analytical model 90. FIGS. 12(a), 12(b), 12(c) and 12(d) also omit information concerning the Z-axial direction (the depth direction of the drawing sheet).

Figure 13:
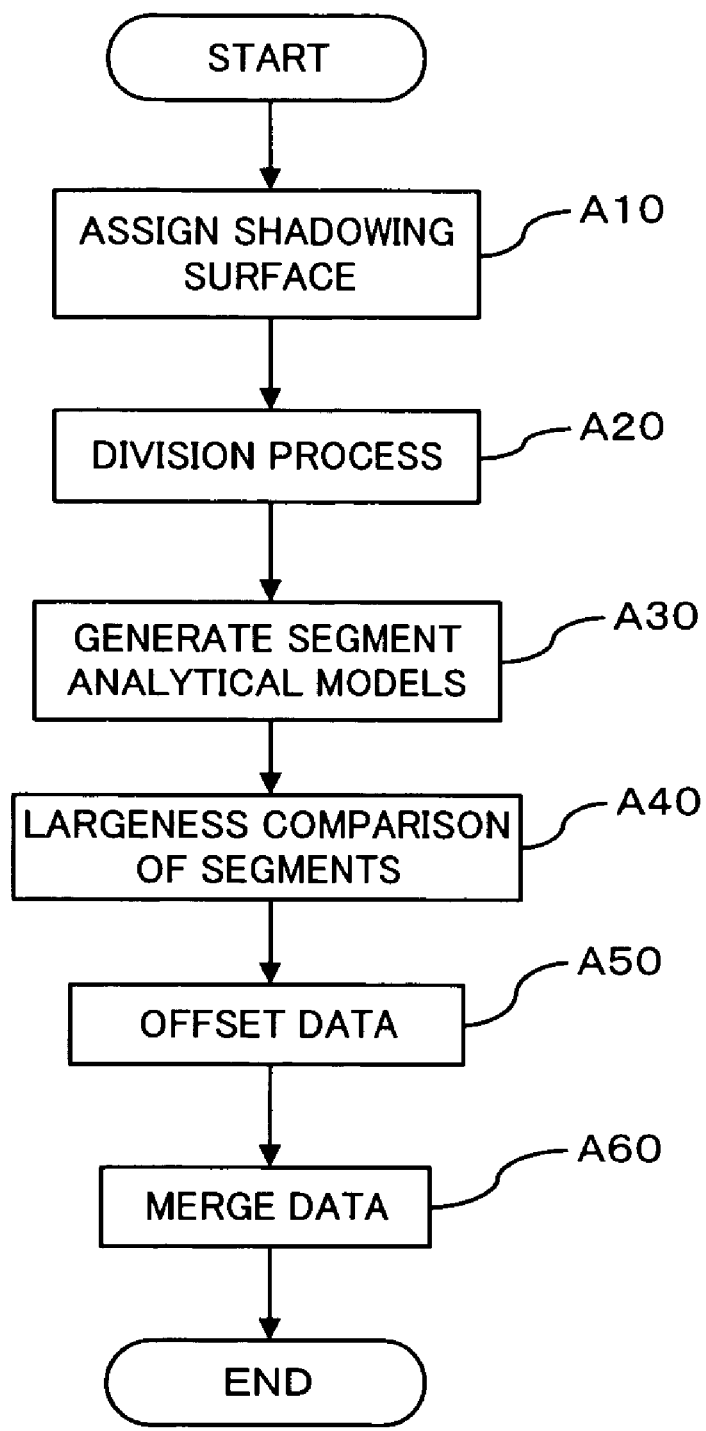
FIG. 13 is a flow diagram showing a succession of procedural steps of simplification of an analytical model by shadowing assignment on an object shape model in the analytical model generating apparatus of FIG. 1.

Description will now be made in relation to a method for simplifying an analytical model 90 in accordance with shadowing assignment to an object shape model 50 in the analytical model generating apparatus 10 of the present embodiment with reference to FIGS. 12(a), 12(b), 12(c) and 12(d) and flow diagram FIG. 13 (steps A10-A60).

An operator inputs an assignment (shadowing surface assignment) to shadow a projection (the face 511 in the example of FIG. 12(a)), which protrudes from a surface (the surface 512 in FIG. 12(a)), into a shadowing surface (the surface 512) via the shadowing surface assignment-inputting section 12 (step A10). Then the object shape model dividing section 14 divides the object shape model 50 into a number of segments (in the example of FIG. 12(b), the segments 503 and 504) at the assigned shadowing surface 512 serving as a division line (step A20).

On the basis of the segments 503 and 504 thus generated, the segment analytical models 903 and 904 are generated by the succession of procedural steps performed by the detail-mesh-model generating section 15, the maximum outer shape mesh model generating section 16, the wall-thickness-region generating section 17 and the overlaying section 18 and other elements (step A30).

Specifically, the detail-mesh-model generating section 15 generates segment detail mesh models (not shown) based on the segments 503 and 504, and the maximum outer shape mesh model generating section 16 generates the segment maximum outer shape mesh models 703 and 704 based on the segment 503 and 504. In addition, the wall-thickness-region generating section 17 generates segment basic wall-thickness regions (not shown) using a basic wall thickness.

After that, the overlaying section 18 overlays the detail mesh model generated by the detail-mesh-model generating section 15 with the basic wall-thickness region generated by the wall-thickness region generating section 17, and extracts one or more sub-regions overlapping a segment detail mesh model from all the sub-regions constituting each corresponding segment basic wall-thickness region, so that the segment analytical models 903 and 904 are generated.

Next, the binding section 19 makes a largeness comparison of segment analytical models 903 and 904 (step A40), and moves (offsets the data of) the smaller segment analytical model 903 (slave) such that the surface (the surface 911 in FIG. 12(c)) from which the smaller analytical model 903 protrudes from becomes identical to the shadowing surface 512 (step A50, see FIG. 12(c)) whereupon the smaller segment analytical model 903 is embedded into the larger segment analytical model 904 (master). After that, the binding section 19 merges the segment analytical model 903 and 904 (step A60, see FIG. 12(d)) and generates the analytical model 90.

Figure 14:
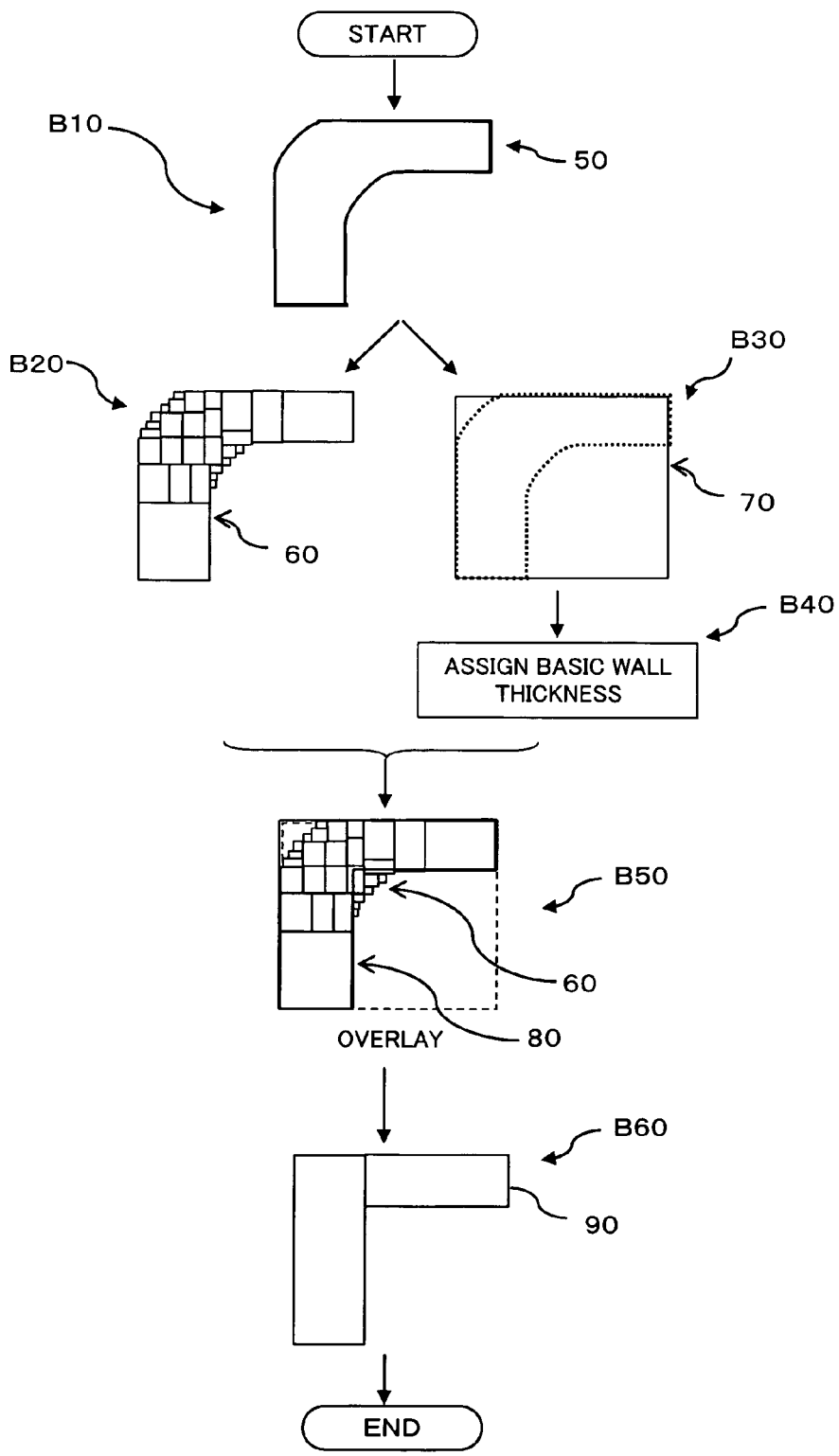
FIG. 14 is a flow diagram schematically showing a succession of procedural steps of generating an analytical model in the analytical model generating apparatus of FIG. 1.

Description will now be made in relation to a method for generating an analytical model in the analytical model generating apparatus 10 according to the present embodiment with reference to flow diagram FIG. 14 (steps B10-B60).

First of all, an object shape model 50 generated by the 3D CAD 31 is obtained (step B10). On the basis of the obtained object shape model 50, the detail-mesh-model generating section 15 generates a detail mesh model 60 (step B20) and the maximum outer shape mesh model generating section 16 generates a maximum outer shape mesh model 70 (step B30).

A basic wall thickness is determined using a basic wall thickness value that the operator has input through the keyboard 107 or the mouse 108 or a basic wall thickness value of the default setting (step B40), and the wall-thickness-region generating section 17 generates a basic wall-thickness region 80 using the determined basic wall thickness.

The overlaying section 18 overlays the detail mesh model 60 generated by the detail-mesh-model generating section 15 with the basic wall-thickness region 80 generated by the wall-thickness-region generating section 17 (step B50), and extracts one or more sub-regions overlapping the detail mesh model 60 from all the sub-regions 81 constituting the basic wall-thickness region 80 so that the analytical model 90 is generated (step B60).

Figure 15:
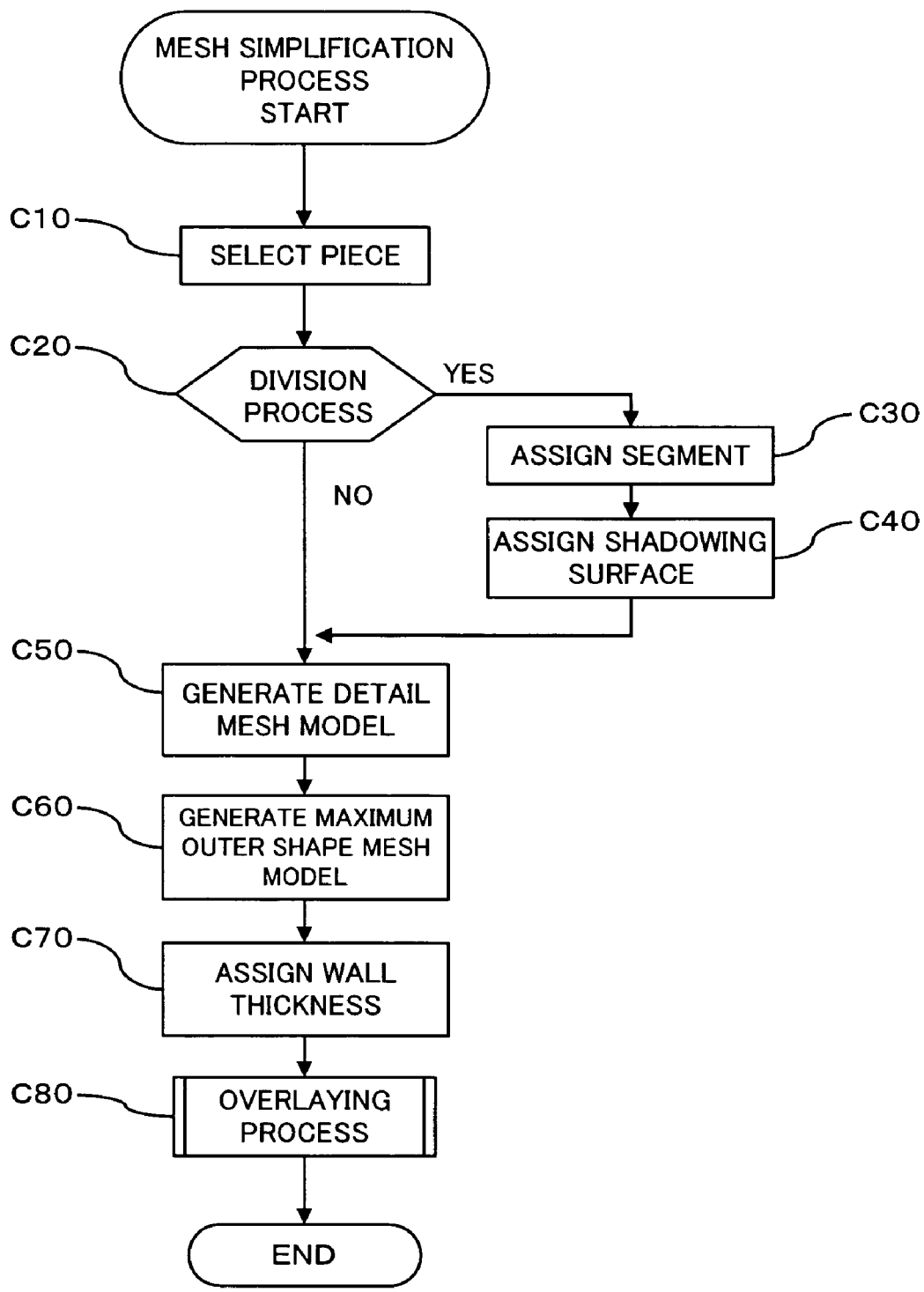
FIG. 15 is a flow diagram schematically showing a succession of procedural steps of generating an analytical model of a complex object shape model in the analytical model generating apparatus of FIG. 1.

Next, description will now be made in relation to a method for generating an analytical model of a complex object shape model 50 in the analytical model generating apparatus 10 with reference to flow diagram FIG. 15 (steps C10-C80).

First of all, the operator selects a particular object shape model 50 from a number of object shape models 50 displayed on the monitor 106 to select the particular object shape model (piece) 50 analytical model 90 of which is to be generated (step C10). Further, judgment is made as to whether a divisional process is to be performed on the selected object shape model 50 (step C20).

If the result of the judgment is negative (see No route of step C20), the detail mesh-model generating section 15 and the maximum outer shape mesh-model generating section 16 generate a detail mesh model 60 (step C50) and a maximum outer shape mesh model 70 of the object shape model 50, respectively, based on the object shape model 50 (step C60).

A basic wall thickness is determined using a basic wall thickness value that the operator has input through the keyboard 107 or the mouse 108 or a basic wall thickness value of the default setting (step C70), and the wall-thickness-region generating section 17 generates a basic wall-thickness region 80 using the determined basic wall thickness.

The overlaying section 18 overlays the detail mesh model 60 generated by the detail-mesh-model generating section 15 with the basic wall-thickness region 80 generated by the wall-thickness-region generating section 17 (step C80), and extracts one or more sub-regions overlapping the detail mesh model 60 from all the sub-regions 81 constituting the basic wall-thickness region 80 so that the analytical model 90 is generated.

Conversely, if the result of the judgment is positive (see Yes route of step C20), the operator inputs and assigns a divisional region for the object shape model 50 through the keyboard 107 or the mouse 108 (step C30). Further, if the object shape model 50 has a projection that is to be shadowed (embedded) into the surface (shadowing surface), the operator assigns the shadowing surface using the keyboard 107 or the mouse 108 (step C40).

The object shape model dividing section 14 divides the object shape model 50 into a number of segments in accordance with the input division assignment and shadowing assignment, and the procedure proceeds to step C50. The below steps C50-C80 are performed on each of the segments to generate segment analytical models, corresponding one to each of the segments. The generated analytical models are bound by the binding section 19 so that the analytical model 90 of the object shape model 50 is generated.

Figure 16:
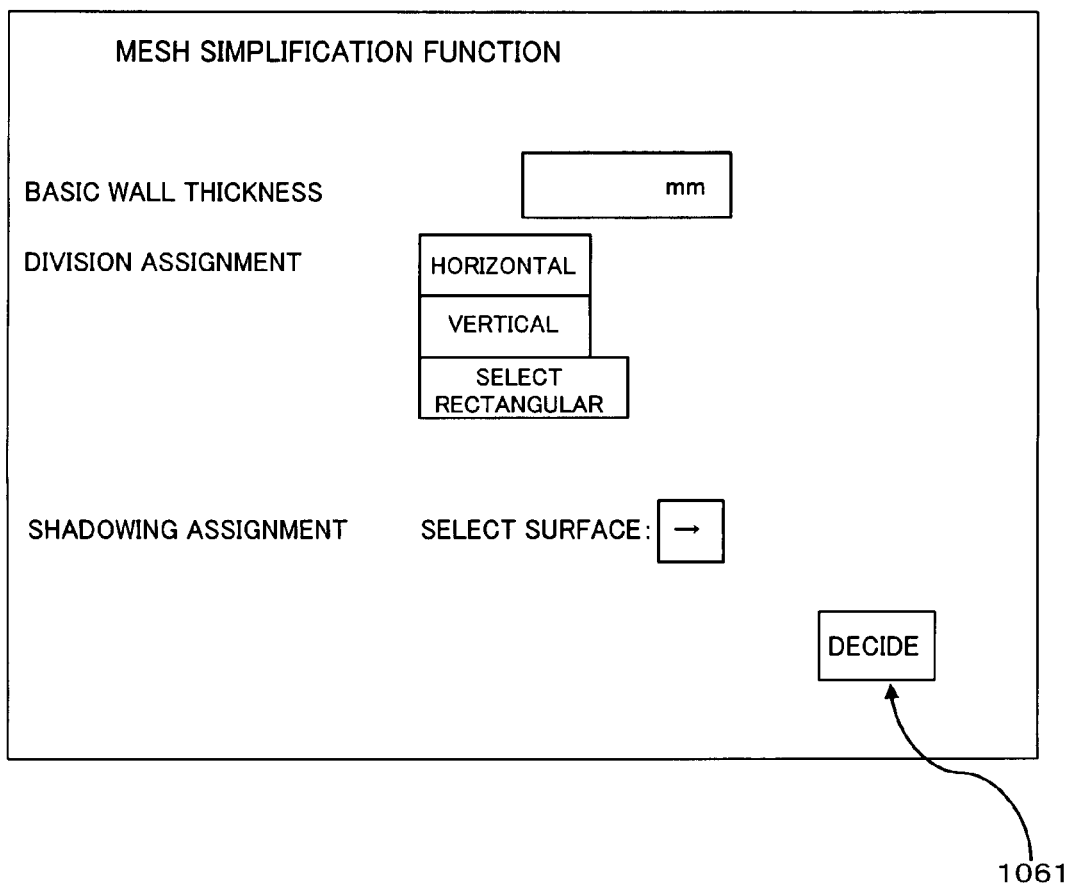
FIG. 16 is a diagram illustrating an example of an inputting screen displayed on the monitor of the analytical model generating apparatus of FIG. 1.
Figure 17:
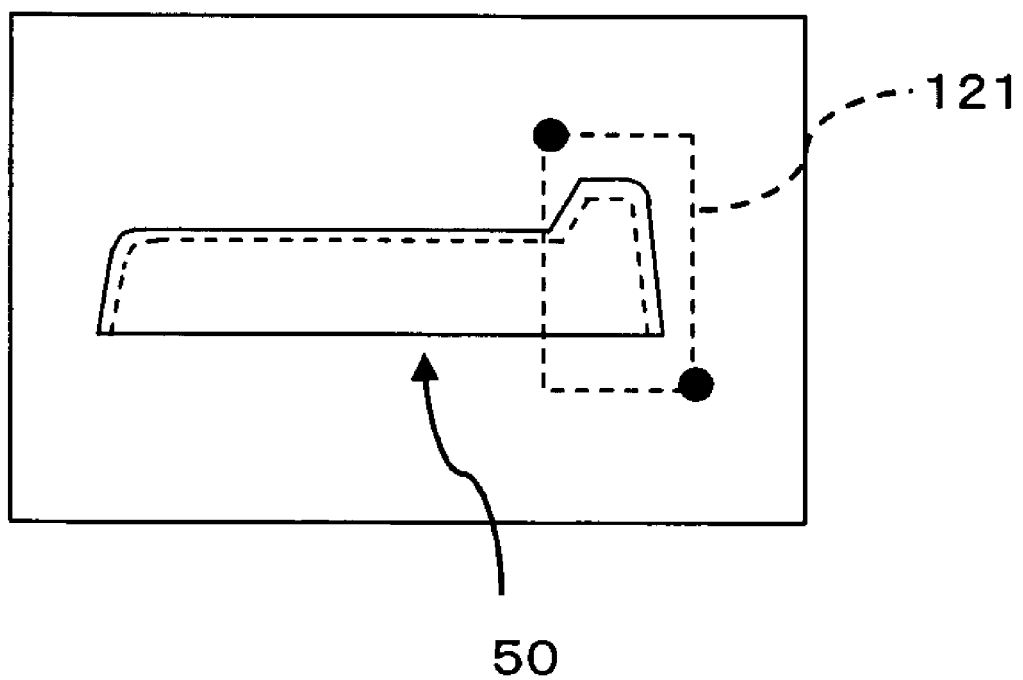
FIG. 17 is a diagram illustrating an example of an inputting screen displayed on the monitor of the analytical model generating apparatus of FIG. 1.
Figure 18:
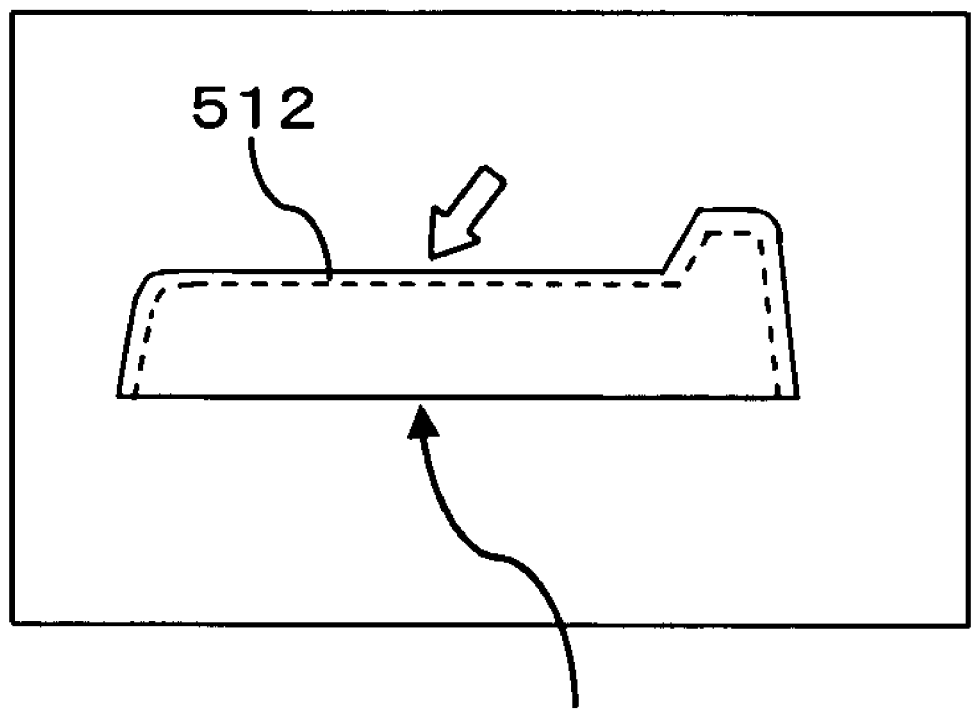
FIG. 18 is a diagram illustrating an example of an inputting screen displayed on the monitor of the analytical model generating apparatus of FIG. 1.

FIGS. 16-18 are diagrams showing examples of input screens displayed on the monitor 106 of the analytical model generating apparatus 10 of the present embodiment. FIG. 16 is an example of an input screen on which a basic wall thickness, division assignment and shadowing assignment are input; FIG. 17 is an example of an input screen on which a divisional region is input; and FIG. 18 is an example showing an input screen on which a shadowing surface is assigned and input. In the present embodiment, the display controller 105 performs control to display these screens on the monitor 106.

The operator inputs a numeral value of a basic wall thickness, selects a manner of divisional assignment from a horizontal line, a vertical line or a select rectangular, and inputs performing shadowing surface assignment on the input screen of FIG. 16.

If the operator selects the item "select rectangular" as division assignment and then selects the "decide" button 1061 on the input screen of FIG. 16, an input screen for divisional region shown in FIG. 17 is displayed on the monitor 106. The operator carries out divisional assignment by enclosing a part of the object shape model 50 by a rectangular divisional region 121 on the input screen of divisional screen.

Further, if the operator selects the item "select surface" as shadowing assignment and then selects the "decide" button 1061 on the input screen of FIG. 16, an assignment input screen shown of the shadowing surface 512 in FIG. 18 is displayed on the monitor 106. The operator carries out shadowing surface assignment by selecting a part of the surfaces of the object shape model 50 on the assignment input screen of the shadowing surface 512.

As described above, the analytical model generating apparatus 10 of the present embodiment can generate a simplified analytical model 90 in a simple process and thereby can reduce time required for generation of the analytical model 90. For example, the analytical model generating apparatus 10 of the present invention can generate a simplified analytical model in 0.3 day while conventional methods take 2.5 days to generate the same model, so that the present invention can reduce the time required for generation to one-eighth.

In addition, since the analytical model generating apparatus 10 suppresses the scale of an analytical model generated, it is possible to reduce the time required for analysis conducted by the downstream analytical tool 32.

Figure 19:
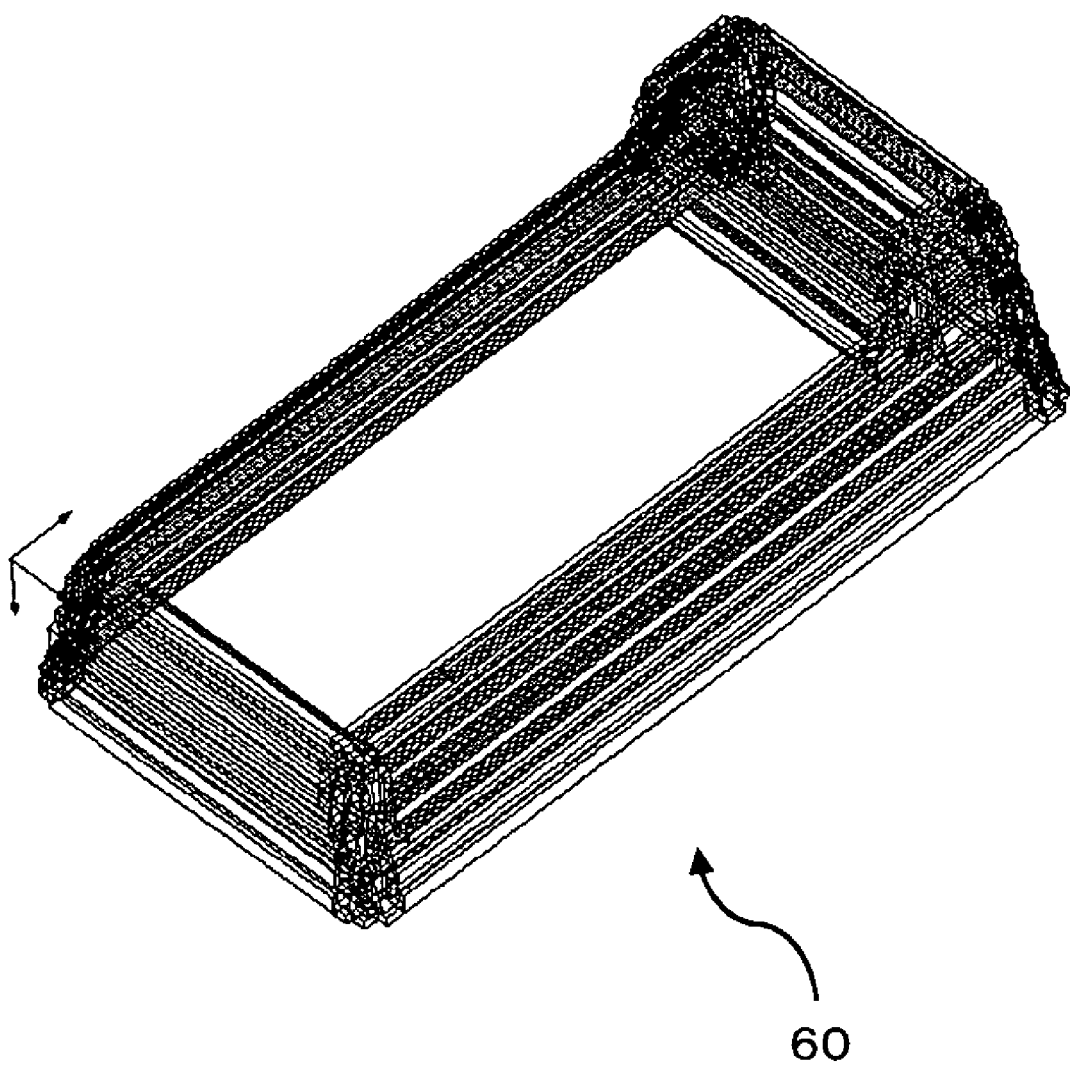
FIG. 19 is a perspective view illustrating an example of a detail mesh model generated based on the object shape model of FIG. 9.
Figure 20:
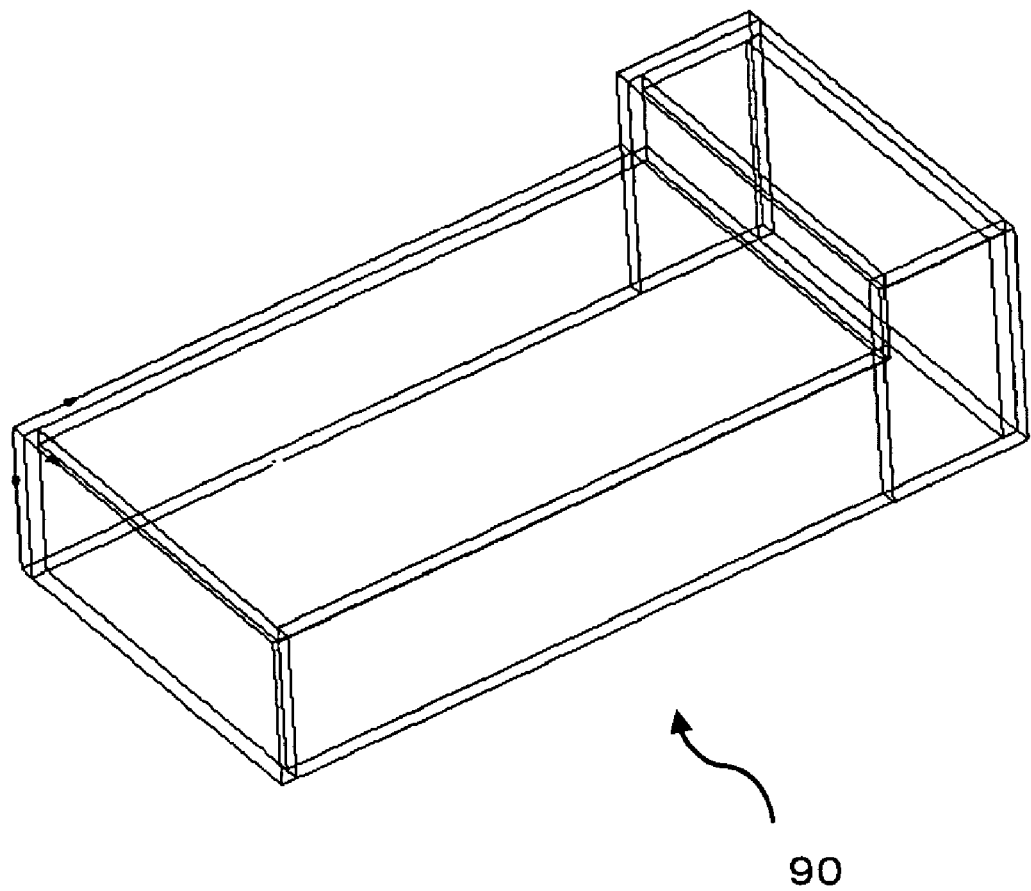
FIG. 20 is a perspective view illustrating an example of an analytical model generated by the analytical model generating apparatus of FIG. 1 on the basis of the object shape model of FIG. 9.
Figure 21A:
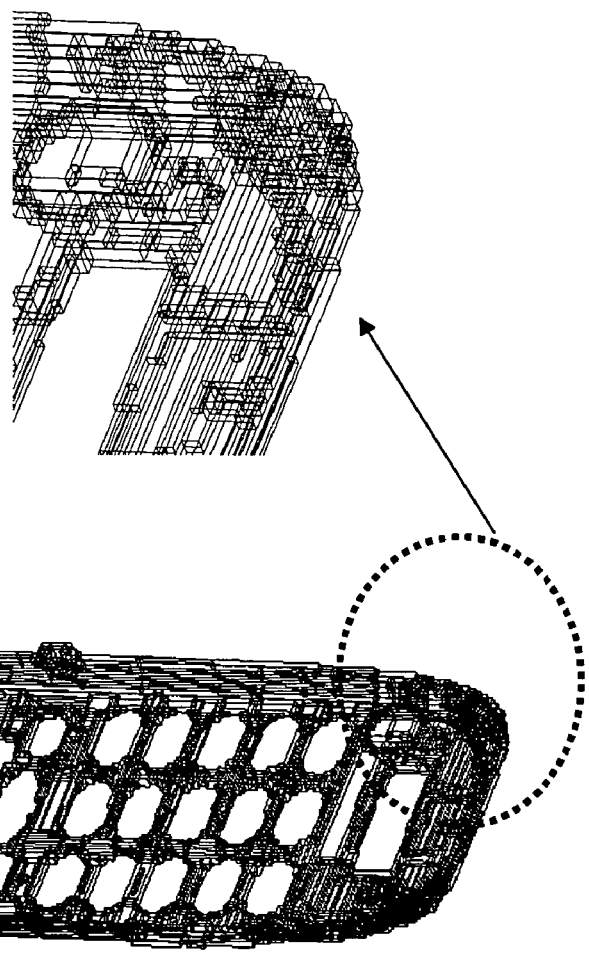
FIGS. 21(a), 21(b), and 21(c) are diagrams illustrating analytical models generated in a conventional analytical model generating method.
Figure 21B:
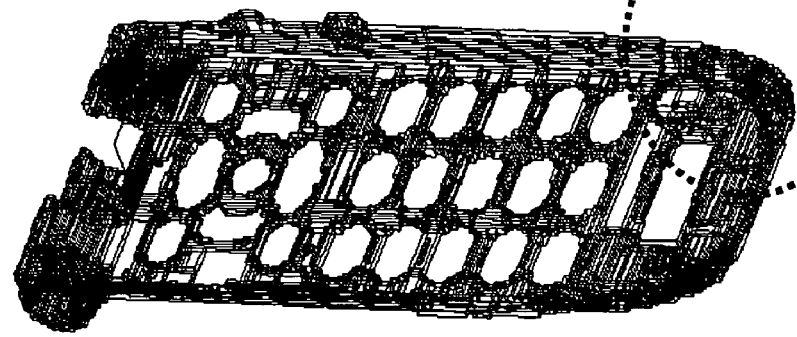
Figure 21C:
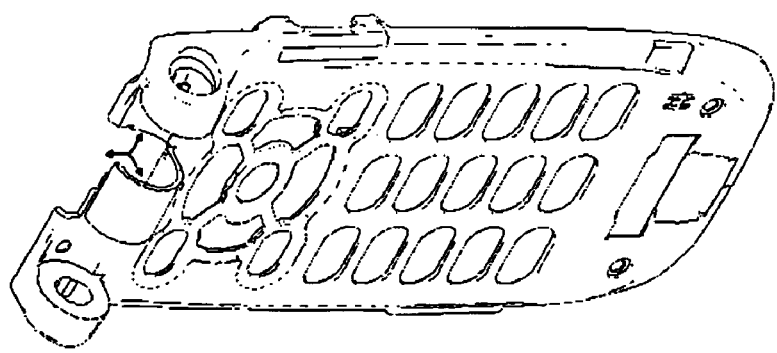

FIG. 19 is a perspective view showing an example of detail mesh model 60 generated based on an object shape model shown in FIG. 9; and FIG. 20 is a perspective view showing an example of an analytical model 90 generated based on the object shape model of FIG. 9 in the analytical model generating apparatus 10.

For example, the analytical tool 32 can analyze a simplified analytical model 90 generated by the analytical model generating apparatus 10 shown in FIG. 20 in 1.5 hours, while analytical tool 32 has taken 8.0 hours to analyze the detail mesh model 60 shown in FIG. 19. As a consequence, the analysis carried out by the analytical tool 32 is reduced to one-fifth.

The analytical model generating apparatus 10 of the present invention can reduce time required for the entire analysis process, and can be effectively used for quality judgment of an object shape model, judgment and decisions on design plans at an early stage of the upstream design process, for example.

In the present analytical model generating apparatus 10, it is possible to generate an analytical model 90 of a complex object shape mode 150 having, for example, a projection and/or a hollow by the following procedure of: inputting division assignment to divide the object shape model 50 into a number of segments by the operator through the division assignment-inputting section 11; in the object shape model dividing section 14, dividing the object shape model 50 into the segments in accordance with the division assignment (divisional position) input through the division assignment-inputting section 11; assigning and inputting a shadowing surface to shadow a projection of the object shape model 50 by the operator through the shadowing surface assignment-inputting section 12 such that the assigned shadowing surface is assumed to be an outer surface of an analytical model 90 to be generated. The above manner can minimize differences among shapes of the object shape model 50, the maximum outer shape mesh model 70 and the analytical model 90, so that accuracy of downstream analysis performed by the analytical tool 32 can be improved.

Since the operator assigns and inputs a shadowing surface that is to be used as a reference into which a projection of the object shape model 50 is to be shadowed through the shadowing surface assignment-inputting section 12, and the analytical model 90 is generated regarding the shadowing surface as an outer surface of the analytical model 90, it is possible to neglect the projection. Thereby, a projection which is judged to only slightly affect the analysis result can be easily and rapidly excluded from the analytical model 90,—the method thereby providing a high level of convenience.

Further, the present invention should by no means be limited to the foregoing embodiment, and various changes or modifications may be suggested without departing from the gist of the invention.

For example, in the present embodiment, the detail-mesh-model generating section 15 generates meshes (orthogonal meshes) in the form of cuboids. The shape of meshes should by no means be limited to cuboids, and alternatively may be in the form of various shapes.

In the above embodiment, the positions and the shapes (sizes) of each orthogonal mesh 61 constituting a detail mesh model 60 are stored in the form of the information as shown in FIG. 5; the positions and the shapes (sizes) of each segment 81 constituting a basic wall-thickness region 80 are stored in the form of the information as shown in FIG. 6; and the information constituting a generated analytical model 90 is stored as shown in FIG. 8. The stored information should by no means be limited to the above examples, and alternatively may be stored in the form of similar or other information.

Further, in the above embodiment described, the wall-thickness-region generating section 17 generates a basic wall-thickness region 80 which has a uniform thickness based on the maximum outer shape mesh model 70. However, the thickness should by no means be limited to being uniform, and alternatively, various thicknesses may be input via the wall-thickness inputting section 13 and the basic wall-thickness region 80 may have partially different thicknesses.

What is claimed is:

1. An apparatus for generating an analytical model of an object shape model, said analytical model being used for numerical analysis, comprising:
    a storage unit;
    a detail-mesh-model generating section which generates a detail mesh model of the object shape model based on the object shape model;
    a maximum outer shape mesh model generating section which generates a maximum outer shape mesh model corresponding to an outline of the object shape model based on the object shape model;
    a wall-thickness-region generating section which generates a basic wall-thickness region, which extends inside the maximum outer shape mesh model from at least a part of surfaces of the maximum outer shape mesh model and which has a predetermined thickness;
    an overlaying section which divides the basic wall-thickness region into a plurality of sub-regions, extracts one or more of the plurality of sub-regions which overlap the detail mesh model, and combines the extracted one or more of the plurality of sub-regions, to thereby generate the analytical model; and
    a storing section which stores the analytical model in the storage unit.

2. An apparatus for generating an analytical model of an object shape model according to claim 1, further comprising a wall-thickness inputting section which inputs a thickness of the basic wall thickness region, wherein
    said wall-thickness-region generating section regards the thickness input from said wall-thickness inputting section as the predetermined thickness.

3. An apparatus for generating an analytical model of an object shape model according to claim 1, further comprising an object shape model dividing section which divides the object shape model into a number of segments, wherein:
    said detail-mesh-model generating section generates the detail mesh model of each of the segments based on each said segment;
    said maximum outer shape mesh model generating section generates the maximum outer shape mesh model corresponding to an outline of each said segment based on each said segment;
    said wall-thickness generating section generates the basic wall-thickness region for each said segment;
    said overlaying section generates said analytical model of each said segment; and
    said apparatus further comprises a binding section which binds said analytical model of each said segment which model has been generated by said overlaying section so that said first analytical model corresponding to the object shape model is generated.

4. An apparatus for generating an analytical model of an object shape model according to claim 1, further comprising a shadowing surface assignment-inputting section for inputting, if the object shape model has a projection which protrudes from a surface of the object shape model, assignment to the surface as a shadowing surface that is to be used as a reference to shadow the projection, wherein
    said analytical model is generated regarding the shadowing surface assigned by said shadowing surface assignment-inputting section as an outer surface of said analytical model.

5. A method for generating an analytic model of an object shape model, said analytical model being used for numerical analysis, comprising the steps of:
    (a) generating a detail mesh model of the object shape model based on the object shape model;
    (b) generating a maximum outer shape mesh model corresponding to an outline of the object shape model based on the object shape model;
    (c) generating a basic wall-thickness region, which extends inside the maximum outer shape mesh model from at least a part of surfaces of the maximum outer shape mesh model and which has a predetermined thickness;
    (d) generating, by a computer, said analytical model by dividing the basic wall-thickness region into a plurality of sub-regions, extracting one or more of the plurality of sub-regions which overlap the detail mesh model, and combining the extracted one or more of the plurality of sub-regions; and
    (e) storing said analytical model into a storage unit.

6. A method for generating an analytic model of an object shape model according to claim 5, said method further comprising the step of inputting a thickness of the basic wall thickness region, wherein
    the thickness assigned in said step of inputting is regarded as the predetermined thickness of the basic wall-thickness region.

7. A method for generating an analytic model of an object shape model according to claim 5, said method further comprising the step of dividing the object shape model into a number of segments, wherein
    the detail mesh model of each of the segments is generated based on each said segment in said step (a),
    the maximum outer shape mesh model of each said segment is generated based on each said segment in said step (b),
    the basic wall-thickness region for each said segment is generated in said step (c),
    said analytical model of each said segment is generated in said step (d), and
    said method further comprises the steps of binding said analytical model of each said segment which model has been generated in said step (d) so that said first analytical model corresponding to the object shape model is generated.

8. A method for generating an analytic model of an object shape model according to claim 5, further comprising the steps of, if the object shape model has a projection which protrudes from a surface of the object shape model, inputting assignment to the surface as a shadowing surface that is to be used as a reference to shadow the projection, wherein said analytical model is generated regarding the shadowing surface assigned in said step of inputting as an outer surface of said analytical model.

9. A computer-readable recording medium storing therein a program for generating an analytical model of an object shape model, said analytical model being used for numerical analysis, wherein said program instructs a computer to function as:

a detail-mesh-model generating section which generates a detail mesh model of the object shape model based on the object shape model;

a maximum outer shape mesh model generating section which generates a maximum outer shape mesh model corresponding to an outline of the object shape model based on the object shape model;

a wall-thickness-region generating section which generates a basic wall-thickness region, which extends inside the maximum outer shape mesh model from at least a part of surfaces of the maximum outer shape mesh model and which has a predetermined thickness; and an overlaying section which divides the basic wall-thickness region into a plurality of sub-regions, extracts one or more of the plurality of sub-regions which overlap the detail mesh model, and combines the extracted one or more of the plurality of sub-regions, to thereby generate said analytical model.

10. A computer-readable recording medium according to claim 9, wherein:

said program further instructs the computer to function as a wall-thickness inputting section which inputs a thickness of the basic wall thickness region; and when the program instructs the computer to function as said wall-thickness-region generating section, the thickness input from said wall-thickness inputting section is regarded as the predetermined thickness.

11. A computer-readable recording medium according to claim 9, wherein:

said program further instructs the computer to function as an object shape model dividing section which divides the object shape model into a number of segments, wherein said program instructs the computer to function as:

said detail-mesh-model generating section generating the detail mesh model of each of the segments based on each said segment;

said maximum outer shape mesh model generating section generating the maximum outer shape mesh model corresponding to an outline of each said segment based on each said segment;

said wall-thickness generating section generating the basic wall-thickness region for each said segment; and said overlaying section generating said analytical model of each said segment; and said program further instructs the computer to function as a binding section which binds said analytical model of each said segment which model has been generated by said overlaying section so that said first analytical model corresponding to the object shape model is generated.

12. A computer-readable recording medium according to claim 9, wherein:

said program instructs the computer to function as a shadowing surface assignment section for inputting, if the object shape model has a projection which protrudes from a surface of the object shape model, assignment to the surface as a shadowing surface used as a reference to shadow the projection; and said program instructs the computer to generate said analytical model regarding the shadowing surface input by said shadowing surface assignment-inputting section as an outer surface of said analytical model.

* * * * *